(12) United States Patent  
Varnica et al.

(10) Patent No.: US 8,209,580 B1  
(45) Date of Patent: *Jun. 26, 2012

(54) ERROR CORRECTION CODING FOR VARYING SIGNAL-TO-NOISE RATIO CHANNELS

(75) Inventors: Nedeljko Varnica, Sunnyvale, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 973 days.

This patent is subject to a terminal disclaimer.

(21) Appl. No.: 12/132,422

(22) Filed: Jun. 3, 2008

Related U.S. Application Data

(63) Continuation-in-part of application No. 11/745,254, filed on May 7, 2007, now Pat. No. 7,685,494.

(60) Provisional application No. 61/050,464, filed on May 5, 2008, provisional application No. 60/798,667, filed on May 8, 2006.

(51) Int. Cl.  
*H03M 13/00* (2006.01)

(52) U.S. Cl. ............... 714/752; 714/786; 714/799

(58) Field of Classification Search ............ 714/752, 714/784, 777  
See application file for complete search history.

(56) References Cited

U.S. PATENT DOCUMENTS

| | | | |
|---|---|---|---|
| 6,732,325 B1 | 5/2004 | Tash et al. | |
| 6,807,648 B1 * | 10/2004 | Cansever et al. | 714/776 |
| 6,961,890 B2 * | 11/2005 | Smith | 714/763 |
| 6,973,604 B2 * | 12/2005 | Davis et al. | 714/710 |
| 6,985,437 B1 | 1/2006 | Vogel | |
| 7,007,220 B2 | 2/2006 | Zhang et al. | |
| 7,505,528 B2 | 3/2009 | Morris | |
| 7,508,704 B2 | 3/2009 | Honma et al. | |
| 7,516,388 B2 * | 4/2009 | Matsumoto | 714/752 |
| 7,516,390 B2 * | 4/2009 | Shen et al. | 714/755 |
| 7,549,103 B2 | 6/2009 | Tsai et al. | |
| 7,555,661 B2 | 6/2009 | Luu | |
| 7,644,336 B2 | 1/2010 | Yang et al. | |
| 7,747,903 B2 | 6/2010 | Radke | |
| 7,823,043 B2 | 10/2010 | Lasser | |
| 2003/0039317 A1 | 2/2003 | Taylor et al. | |
| 2006/0135080 A1 | 6/2006 | Khandekar et al. | |
| 2006/0242530 A1 | 10/2006 | Lu et al. | |

OTHER PUBLICATIONS

Barry, John R., "Low-Density Parity-Check Codes," George Institute of Technology, pp. 1-20, Oct. 5, 2001.

Boston, Nigel, "Graph-Based Codes," Departments of Mathematics, Electrical and Computer Engineering, and Computer Sciences, University of Wisconsin, pp. 1-21, Jul. 12-15, 2004.

Leiner, Bernhard M.J., "LDPC Codes—a Brief Tutorial," pp. 1-9, Apr. 8, 2005.

Luby, Michael G., et al., "Improved Low-Density Parity-Check Codes Using Irregular Graphs," IEEE Transaction on Information Theory, vol. 47, No. 2, pp. 585-598, Feb. 2, 2001.

Richardson, Thomas J., et al., "Design of Capacity-Approaching Irregular Low-Density Parity-Check Codes," IEEE Transaction on Information Theory, vol. 47, No. 2, pp. 619-637, Feb. 2, 2001.

Gallager, Robert J., "Low-Density Parity-Check Codes," pp. 1-90 (Jul. 1963).

* cited by examiner

*Primary Examiner* — Esaw Abraham

(57) ABSTRACT

An error rate sensitive error correction (ERSEC) system acting on product code is disclosed herein that improves error correction effectiveness by allocating error correction resources based on error susceptibility. The ERSEC system acts on vectors (bits or multiple-bit symbols) of a data matrix arranged from a data sequence. The ERSEC system obtains a signal-to-noise (SNR) profile that includes different SNR domains, assigns at least two vectors of the same dimension to different SNR domains, and allocates a level of error correction for the assigned vectors based on the SNR magnitudes of the assigned-to SNR domains.

42 Claims, 21 Drawing Sheets

| SYMBOL BIT | DOMAIN |
|---|---|
| 1 | DOMAIN 306 |
| 2 | DOMAIN 306 |
| 3 | DOMAIN 306 |
| 4 | DOMAIN 306 |
| 5 | DOMAIN 306 |
| 6 | DOMAIN 306 |
| 7 | DOMAIN 306 |
| 8 | DOMAIN 306 |
| 9 | DOMAIN 306 |
| 10 | DOMAIN 304 |
| 11 | DOMAIN 302 |
| 12 | DOMAIN 302 |
| 13 | DOMAIN 302 |
| 14 | DOMAIN 302 |
| 15 | DOMAIN 304 |
| 16 | DOMAIN 306 |
| 17 | DOMAIN 306 |
| 18 | DOMAIN 304 |
| 19 | DOMAIN 302 |
| 20 | DOMAIN 302 |
| 21 | DOMAIN 302 |
| 22 | DOMAIN 302 |
| 23 | DOMAIN 304 |
| 24 | DOMAIN 306 |
| 25 | DOMAIN 306 |
| 26 | DOMAIN 306 |
| 27 | DOMAIN 306 |
| 28 | DOMAIN 306 |
| 29 | DOMAIN 306 |
| 30 | DOMAIN 306 |
| 31 | DOMAIN 306 |
| 32 | DOMAIN 306 |

$$D = \begin{bmatrix} I_1 & I_2 & I_3 & I_4 & I_5 & I_6 & P_1 & P_2 \\ I_7 & I_8 & I_9 & I_{10} & I_{11} & I_{12} & P_3 & P_4 \\ I_{13} & I_{14} & I_{15} & I_{16} & I_{17} & I_{18} & P_5 & P_6 \\ P_7 & P_8 & P_9 & P_{10} & P_{11} & P_{12} & P_{13} & P_{14} \end{bmatrix}$$

ERROR CORRECTION CODING FOR VARYING SIGNAL-TO-NOISE RATIO CHANNELS

CROSS-REFERENCE TO RELATED APPLICATIONS

This application claims the benefit of U.S. Provisional Application No. 61/050,464, "Error Correction Coding for Varying Signal-to-Noise Ratio Channels" filed on May 5, 2008, and is a Continuation-in-part of U.S. patent application Ser. No. 11/745,254, "Error Correction Coding for Varying Signal-to-Noise Ratio Channels" filed on May, 7, 2007, now U.S. Pat. No. 7,685,494, which in turn claims the benefit of U.S. Provisional Application No. 60/798,667, "Methodology and Apparatus for Improved Code Design for Time or Space-Varying Channels with Known or Estimated SNR Patterns" filed on May 8, 2006. The entire disclosures of the prior applications are hereby incorporated by reference herein in their entirety.

BACKGROUND

Error correction coding techniques can be used to reduce errors introduced during digital data transmission or storage. Prior to transmission, for example, each piece of data, such as a 16-bit word, can be encoded to incorporate additional information so that upon receipt, the data can be recovered even when errors are introduced during transit between transmitter and receiver.

In addition, two or more coding techniques can be combined to create more powerful encoding schemes, such as product encoding scheme. Product code can act on a data matrix that can be arranged from a data sequence. The data matrix can include a first dimension and a second dimension. Product code can encode vectors of the first dimension to incorporate additional information, and then encode vectors of the second dimension to further incorporate additional information.

SUMMARY

An error rate sensitive error correction (ERSEC) system using product code is disclosed herein that improves error correction effectiveness by allocating error correction resources based on error susceptibility.

For example, for certain channels signal-to-noise ratio (SNR) can be a measure of error susceptibility. For other channels, different measures may be more appropriate than SNR. When applied to a communication channel, the SNR may be determined, estimated, or detected to be different for different portions of a data sequence or matrix so that errors may be more likely to be introduced in one portion of the data sequence (or matrix) than other portions. The ERSEC system may allocate more robust error correction coding to those portions of the data transmission that may experience lower SNRs than other portions. Thus, the ERSEC system may encode data that is expected to experience lower SNR with greater error correction capability in an irregular low density parity check (LDPC), for example, than other portions for which higher SNRs are expected.

Correspondingly, in a storage medium application such as an optical disc (e.g., CD, DVD, holographic optical disc, etc.), different portions of the optical disc medium may be more error prone than other portions due to the physics of the read/write mechanisms or the materials of a particular optical disc, for example. The SNRs for different portions of the optical disc may be predetermined based on the optical disc/disc drive design, estimated based on past experience or detected by tests that determine bit-error-rates (BERs), for example. As in the communication channel example, the ERSEC system may encode the data bits with error correction capabilities that match the SNRs of the domains, which the data bits are expected to experience.

Aspects of the disclosure can be directed to a method for error correction coding of data arranged in a matrix form. The method can act on one or both of the first dimension vectors and second dimension vectors of the data matrix. The method can obtain a signal-to-noise (SNR) profile that includes different SNR domains, assign at least two vectors of the same dimension to different SNR domains, and allocate a level of error correction for the assigned vectors based on the SNR magnitudes of the assigned-to SNR domains.

Further, the method can generate the vectors using at least one of Hamming coding, Reed-Solomon coding, and regular low-density parity-check (LDPC) coding, and allocate codes of higher level of error correction to the vectors that are assigned to SNR domains having smaller SNR magnitudes.

In addition, the method can generate the vectors using irregular LDPC coding, and assign variable nodes having higher degrees to portions of the vectors that are assigned to SNR domains having smaller SNR magnitudes.

To use the irregular LDPC, the method can select an H-matrix that includes a mixture of variable node degrees that is consistent with an allocation of levels of error correction, and optimize an assignment of portions of a vector to variable nodes of the selected H-matrix based on density evolution.

Alternatively, the method can generate the vectors using at least one of Hamming coding, Reed-Solomon coding, and regular low-density parity-check (LDPC) coding, and permute bits of the vectors across different SNR domains. The bits of the vectors can be in the symbol level.

BRIEF DESCRIPTION OF THE DRAWINGS

Various exemplary embodiments of this disclosure will be described in detail with reference to the following figures, wherein like numerals reference like elements and wherein:

FIG. 8 shows an exemplary table showing a mapping of the two dimensional code matrix onto SNR domains of a holographic page;

FIG. 10 shows an exemplary code matrix generated by applying product code on a data matrix;

DETAILED DESCRIPTION OF EMBODIMENTS

Due to differences in temporal or spatial parameters of a channel, error susceptibility may not be even in the channel. An error correction system that provides different level of error correction based on error susceptibility can be preferred to improve error rate and save overhead of error correction cost. Aspects of the disclosure can be directed to an error sensitive error correction (ERSEC) system that provides various levels of error correction capability to a channel.

Figure 1:
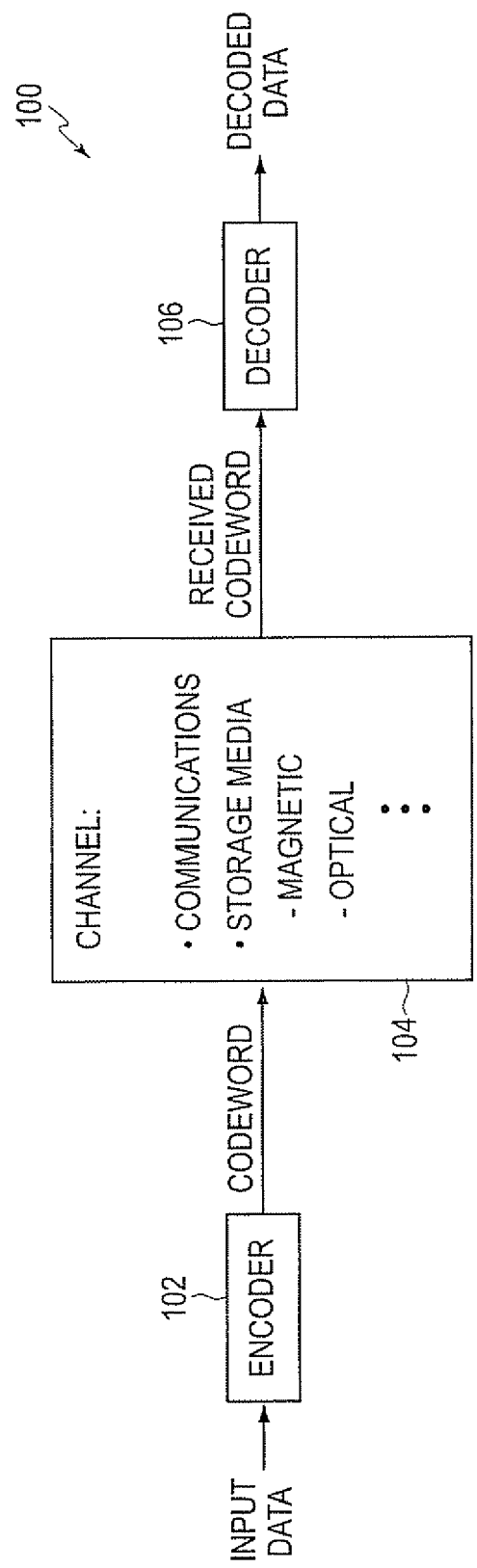
FIG. 1 shows a block diagram of an exemplary error rate sensitive error correction (ERSEC) system.

FIG. 1 shows a block diagram of an exemplary error rate sensitive error correction (ERSEC) system 100 that includes an encoder 102 and a decoder 106. Codewords (or codevectors) output from encoder 102 are transmitted through a channel 104, received at decoder 106 as received codewords (or received codevectors), decoded and outputted from decoder 106 as decoded data that corresponds to input data received by encoder 102. ERSEC system 100 sets parameters in encoder 102 and decoder 106 to protect different portions of the input data with different levels of error correction coding based on error susceptibility of each portion.

As indicated in FIG. 1, the word "channel" is used broadly to include communication channels such as digital wired or wireless communications over a network, for example, as well as any other system or device through which data is passed between encoder 102 and decoder 104. Data storage devices are channels within this broad meaning, for example. In this case, data can be encoded by encoder 102, stored on a storage medium, later retrieved from the storage medium, and decoded by decoder 106.

Figure 2:
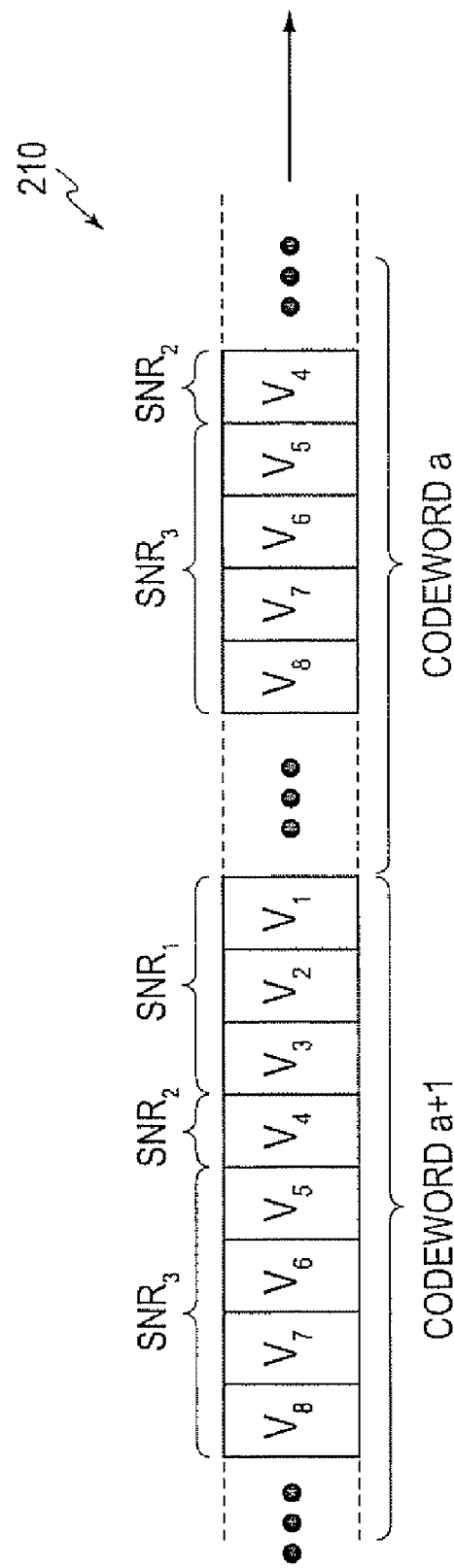
FIG. 2 shows an example of an ERSEC system transmission over a communication channel.

FIG. 2 shows an example of ERSEC system operation in a communication environment 210 using transmission media such as microwave, coaxial cable, computer network, satellite, and the like. In FIG. 2, a baseband protocol is used as an example where binary codewords (or codevectors) "a" and "a+1" are transmitted in blocks of symbol bits indicated as $V_1, V_2, \ldots$. Each symbol bit may experience different error susceptibility, which can be measured by signal to noise ratio (SNR). Higher SNR can mean lower error susceptibility, and lower SNR can mean higher error susceptibility. For example, bits $V_1$-$V_3$ are expected to experience $SNR_1$, $V_4$ is expected to experience $SNR_2$, and $V_5$-$V_8$ are expected to experience $SNR_3$, where $SNR_1 > SNR_2 > SNR_3$. Based on this SNR profile, ERSEC system 100 can set parameters of encoder 102 to encode $V_1$-$V_3$ using a low level of error correction, $V_4$ using a medium level of error correction, and $V_5$-$V_8$ using a high level of error correction so that the bit error rate (BER) of the transmission over channel 104 is substantially steady.

The SNR profile can be estimated for a particular channel. For example, in a communication channel over computer networks, the SNR for each portion of a data transmission can be affected by known mechanisms that are dependent on the position of symbol bits in particular locations within a codeword (or codevector). For example, in baseband protocols, a clock signal is often retrieved from the received bits, and depending on a particular clock retrieval scheme, different bits in a data sequence can be more or less susceptible to reception error. Thus, an SNR profile can be estimated for each symbol bit position of a data sequence for the entire transit from encoder 102 to decoder 106.

Figure 3:
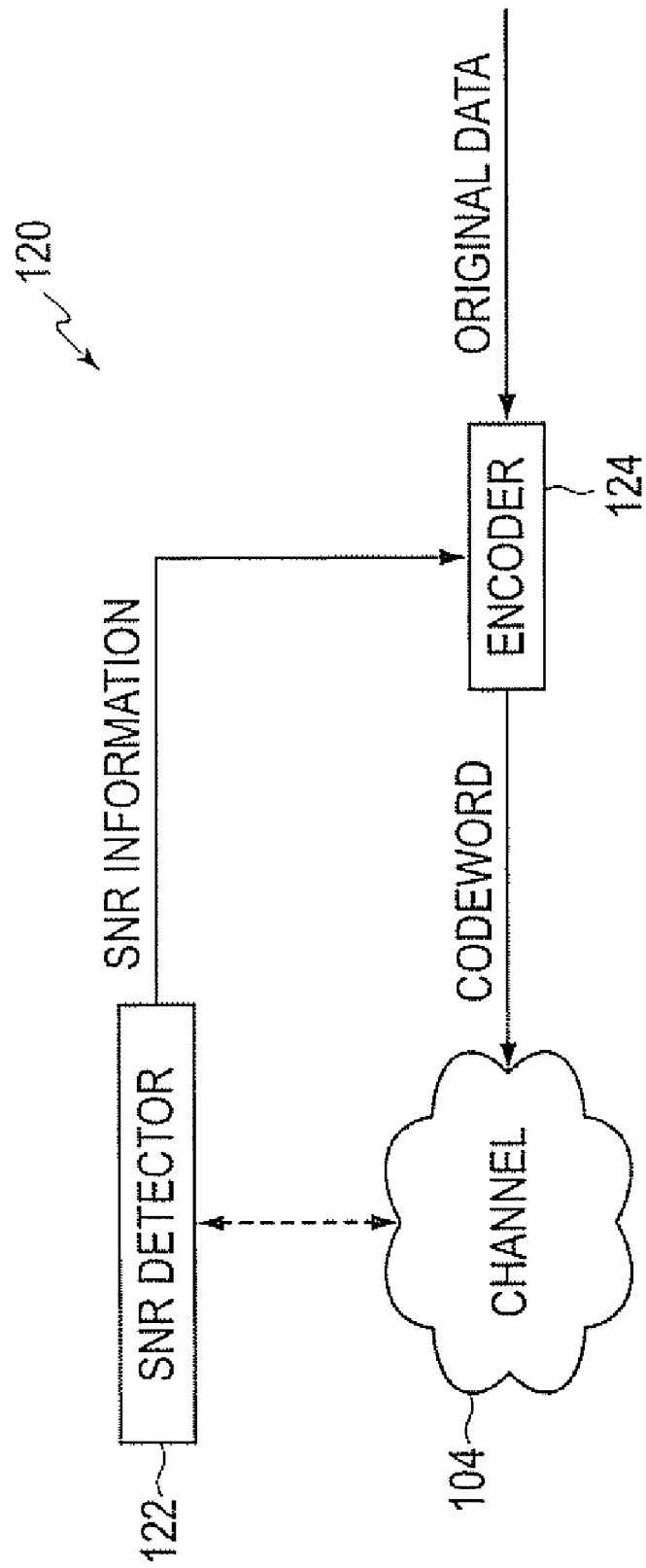
FIG. 3 shows a block diagram of an exemplary SNR detection for adaptive encoding.

Transmitting and receiving test data sequences, for example, can also be used to determine the SNR profile. FIG. 3 shows an exemplary SNR detection system 120 that includes an SNR detector 122 and an encoder 124. Based on BERs obtained using the test data sequences, SNR detector 122 can generate an SNR profile and send it to encoder 124 for updating assignment of error correction levels to codeword (codevector) bits, for example. SNR detector 122 can be part of a communication network such as a base station for cell phone communications, for example. Alternatively, SNR detector 122 can be incorporated in encoder 124, so that periodically, encoder 124 can execute an error correction level update cycle to "sample" a current SNR profile. In this way, encoder 124 can adapt to changing SNR environment to achieve a lower BER than non-adaptive error correction systems.

For a storage medium channel, the SNR profile can be determined by the manufacturer and stored in the storage medium, or determined by a recording device prior to recording, for example. Similar to determining bad portions of a magnetic disk where "1"s are written over portions of tracks that have non-usable portions, a recording device can write and then read test data for a specific media and determine the SNR profile. A dedicated portion of the storage media can be set aside to storing error correction parameters where the SNR profile, encoding, and/or decoding parameters can be stored as a look-up table, for example.

Figure 4:
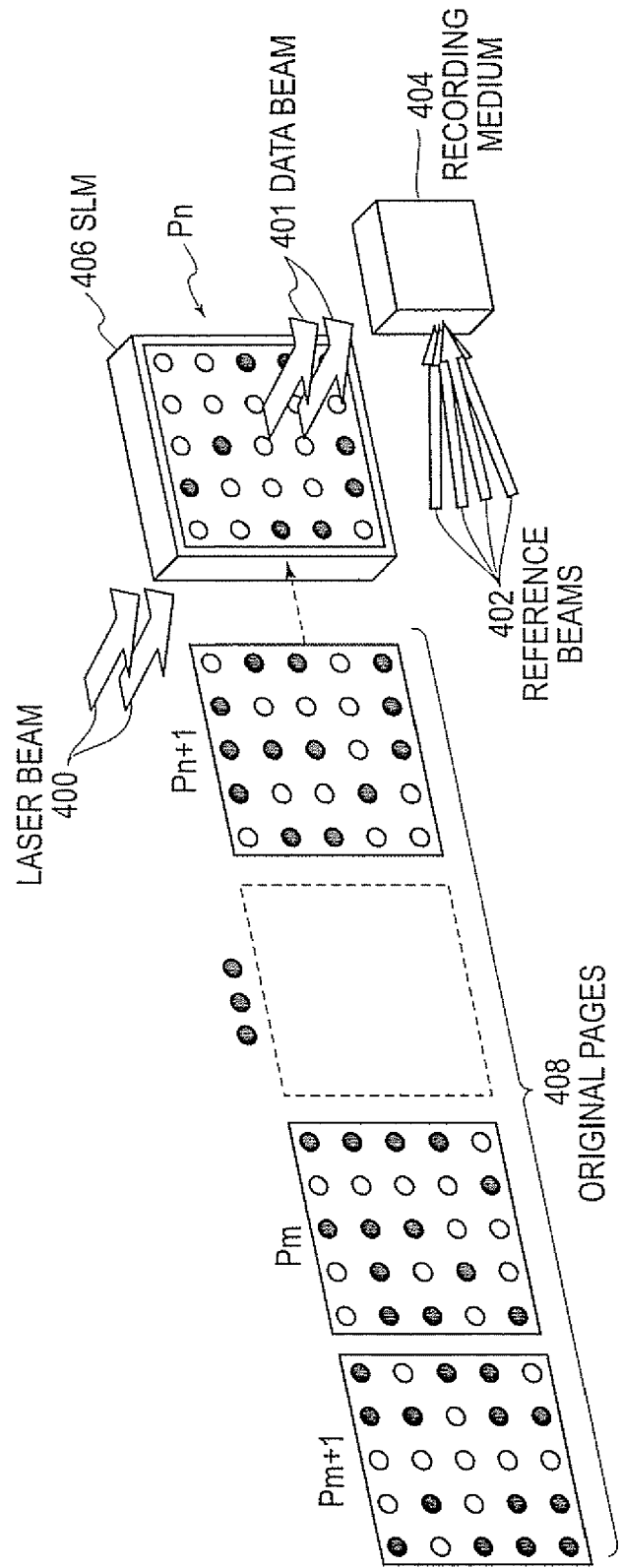
FIG. 4 shows an exemplary holographic recording system.

For illustrative purposes, the operations of an exemplary ERSEC system 100 is discussed below in the context of a holographic storage medium that can store data in the form of three-dimensional book including a set of two-dimensional images called pages. FIG. 4 shows an example of a holographic storage system that includes a spatial light modulator (SLM) 406 which is illuminated by a laser beam 400 to form a data beam 401. Data beam 401 illuminates a recording medium 404 at a selected writing location. The same writing location is also illuminated by one of many reference beams 402 directed at a particular angle to form an interference pattern that is recorded in recording medium 404 as a hologram. A first set of multiple original pages 408 (e.g., Pn–Pm–1) can be stored as holograms at the same selected writing location of SLM 406, where each of the first set of original pages 408 are stored using a different one of reference beams 402 directed at a unique angle, for example. After all of reference beams 402 are used, an adjacent writing location can be selected for recording a next set of original pages 408 (e.g., Pm, Pm+1, ... ).

Figure 5:
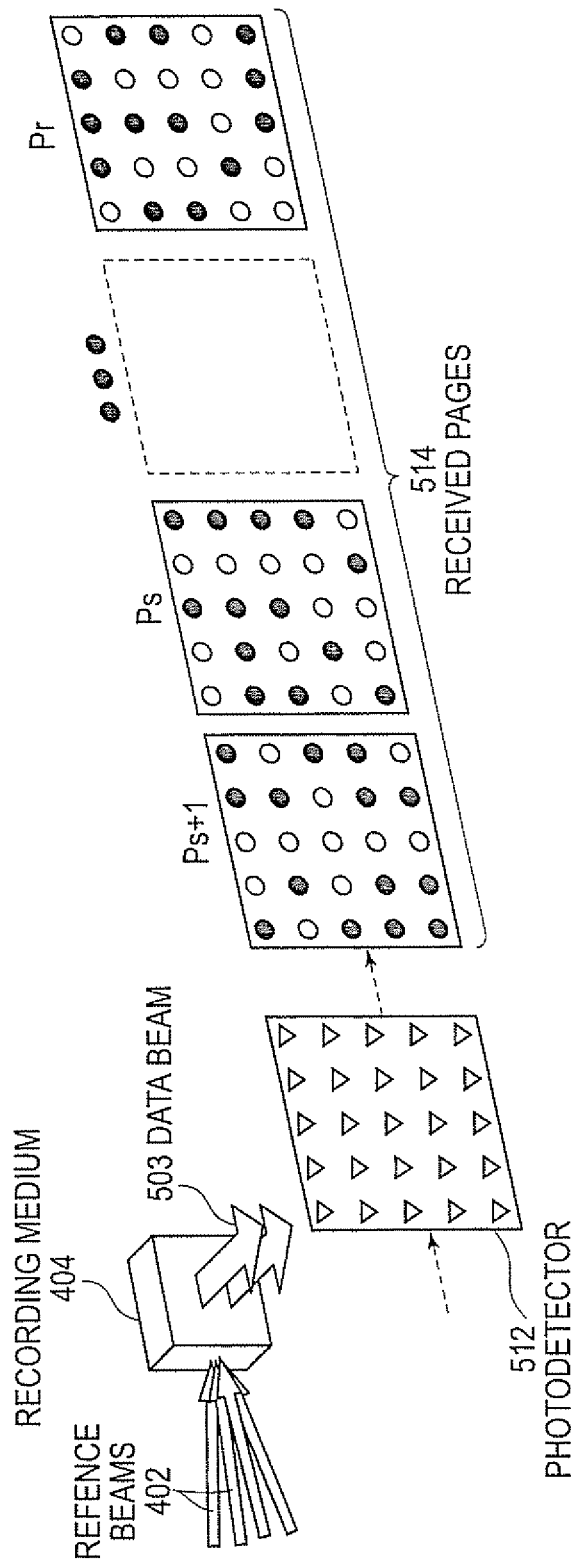
FIG. 5 shows an exemplary holographic retrieval system.

As shown in FIG. 5, recorded pages can be retrieved by illuminating recording medium 404 with one of reference beams 402 at a selected reading location and the writing angle to generate data beam 503 that is imaged onto a sensor 512 such as a photo detector array, for example. Sensor 512 converts data beam 503 into a page, and after multiple conversions, sets of received pages 514 (e.g., Pr–Ps−1; Ps, Ps+1, . . . ) are formed.

Recorded holograms of different reference beams 402 and holograms of adjacent writing locations can introduce errors when reading a page from recording medium 404. Such susceptibility to errors can be represented by one or more SNRs. For example, an SNR of a central portion of a page can be higher than at page edges, and worst at page corners due to influence of three adjacent pages. Thus, an SNR profile can be generated based on BERs of different positions within a page.

Figure 6:
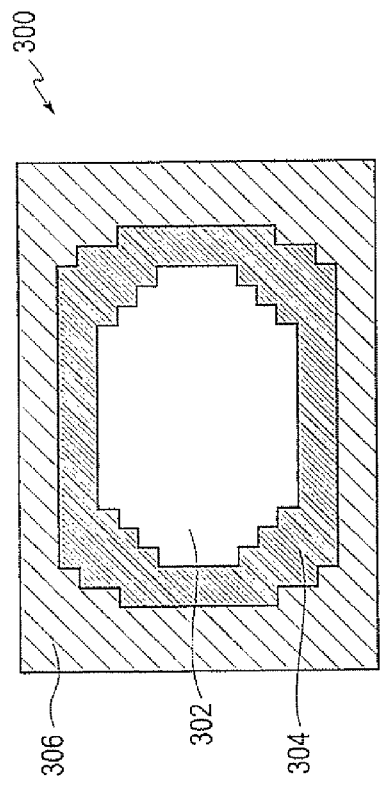
FIG. 6 shows an exemplary SNR profile for a holographic page.

FIG. 6 shows an exemplary SNR profile for a page 300 in recording medium 404. While the SNR can vary in a continuous manner across page 300, FIG. 6 shows an SNR profile having three domains 302, 304 and 306 as an example, where a single average SNR is assigned to each domain 302-306. The presence of numerous SNR values within page 300 can be accounted for by defining contours of domains 302-306 based on a range of SNR values, or defining the contours of domains 302-306 by an SNR tolerance value (i.e., ±5.0%). However, in this example, domain 302 is associated with $SNR_1$, domain 304 is associated with $SNR_2$, and domain 306 is associated with $SNR_3$, and $SNR_1 > SNR_2 > SNR_3$. This SNR profile can be stored in recording medium 404 at a predetermined location so that recording devices implementing the ERSEC system can access the SNR profile to encode data with different error correction levels according to expected error rates based on the SNR profile.

Figure 7:
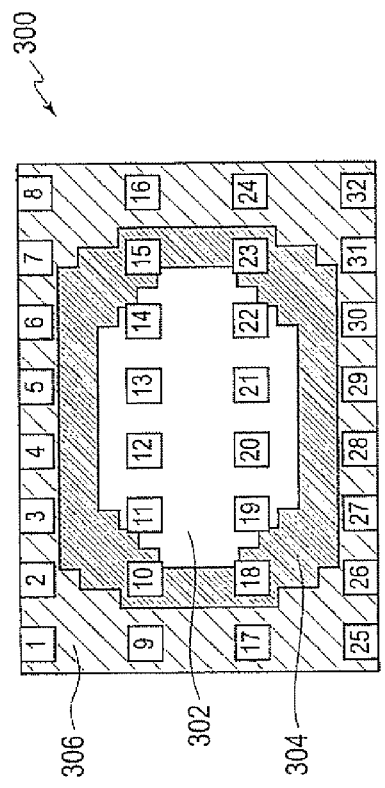
FIG. 7 shows an exemplary recording profile of a two dimensional matrix onto a holographic page.

Data can be recorded in the recording medium 404 according to a predetermined recording profile. FIG. 7 shows an exemplary recording profile of page 300. 32 symbol bits are recorded in the page 300. Symbol bits 1-8, 9, 16, 17, 24, and 25-32 are recorded into domain 306; bits 10, 15, 18 and 23 are recorded into domain 304; and bits 11-14 and 19-22 are recorded into domain 302. This correspondence between symbol bits 1-32 and domains 302-306 can be saved in a table such as table 822 shown in FIG. 8.

Figure 9:
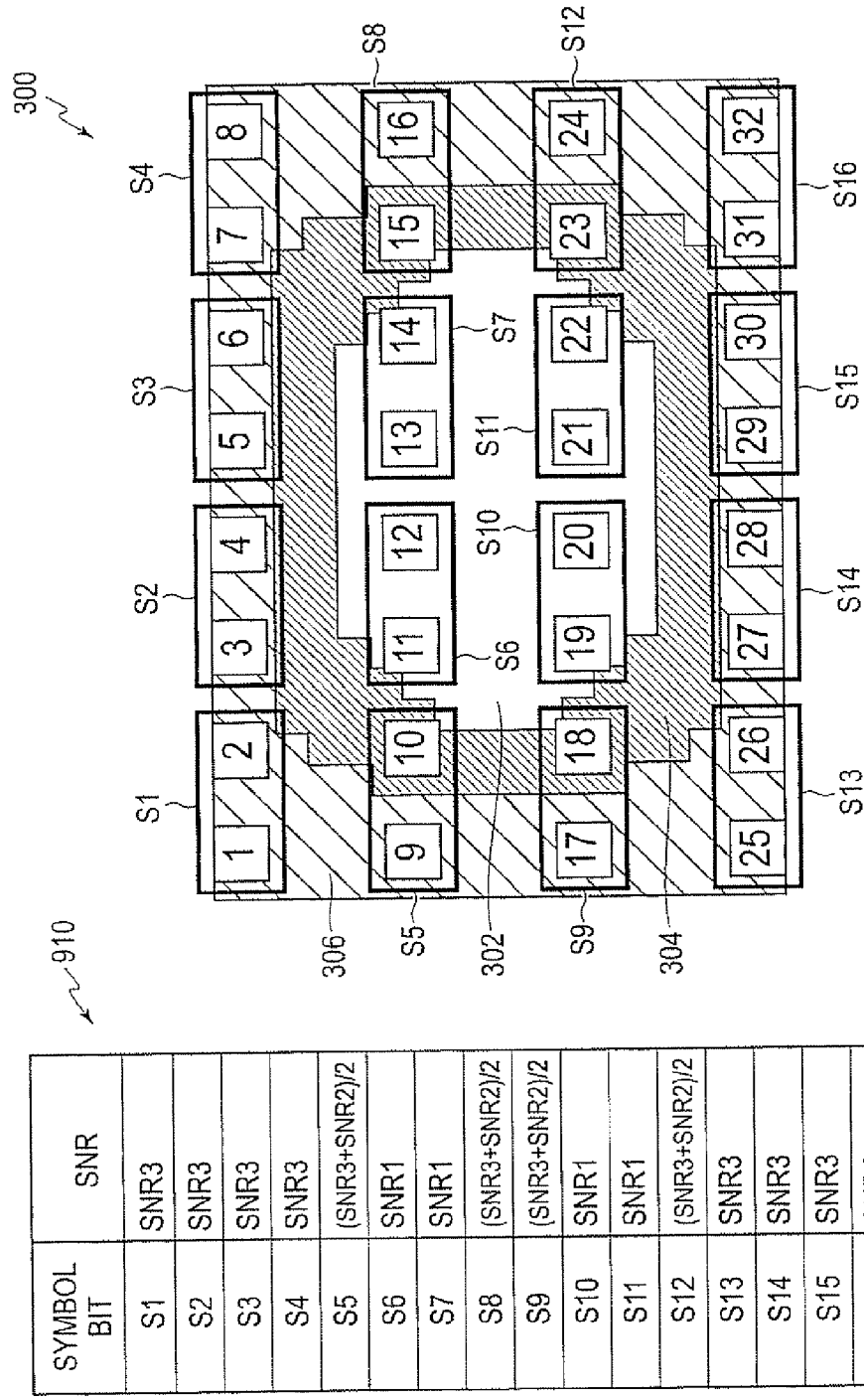
FIG. 9 shows an exemplary aggregation of symbol bits to construct larger Galois Field.

Additionally, adjacent bits may have higher correlations. For example, if one bit is error, an adjacent bit can be error with high probability. Therefore adjacent bits can be aggregated into larger Galois Field (GF). FIG. 9 shows an exemplary aggregation profile, where two adjacent symbol bits in the horizontal direction can be aggregated to form a new symbol bit in larger GF. For example, if symbol bits 1 and 2 are binary bits in GF(2), thus symbol bit S1, which is an aggregation of symbol bits 1 and 2, can be a symbol bit in GF(4). An SNR of the new symbol bit can be determined based on SNRs of the aggregated adjacent symbol bits, such as an average in table 910. It should be understood that while the exemplary aggregation profile is in the horizontal direction, such direction is not required. Adjacent bits can be aggregated in vertical direction, even bits in different pages but written in the same location can be aggregated if higher correlation is present.

Product code is one of the effective coding techniques used in communication and data storage applications. FIG. 10 shows a two dimensional coded matrix D that is constructed by encoding an information matrix with an exemplary product code technique. Information bits I1-I18 can be arranged into a 3×6 information matrix 1010 having a horizontal dimension and a vertical dimension. Vectors of the horizontal dimension can be encoded into horizontal dimension codevectors by a first set of codes to add redundant information. For example, vector [I1-I6] can be encoded by a first set code to add parity check bits P1 and P2, vector [I7-I12] can be encoded by the same code or another first set code to add parity check bits P3 and P4, and vector [I13-I18] can be encoded by the same code or another first set code to add parity check bits P5 and P6. Additionally, vectors of the vertical dimension can be encoded into vertical dimension codevectors by a second set of codes to add redundant information. For example, vector [I1 I7 I13] can be encoded by a second set code to add parity check bit P7. The parity check bits from the horizontal encoding can also be encoded. For example, vector [P1 P3 P5], which comprises parity check bits, can be encoded by the same code or another second set code to add parity check bit P13. It should be understood that, while the horizontal vector is encoded first in the example, such sequence is not required.

Figure 11:
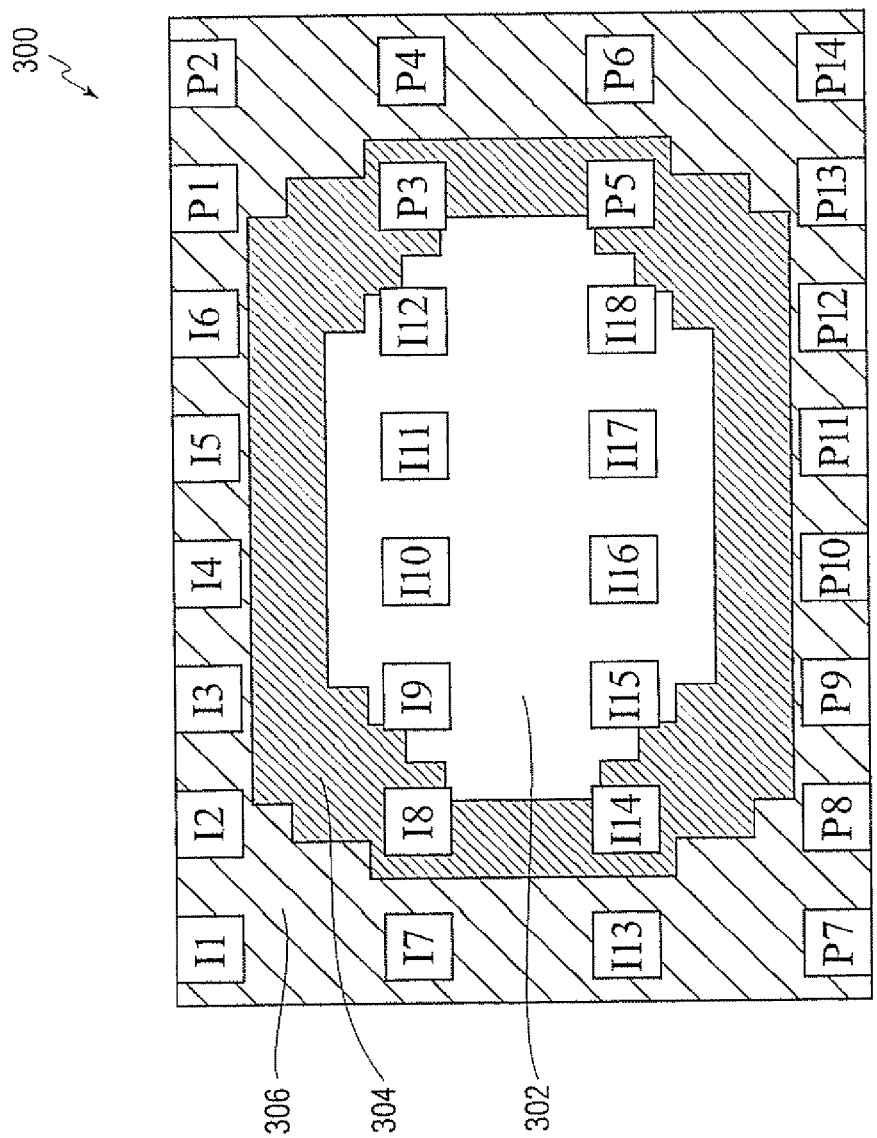
FIG. 11 shows an exemplary recording profile of the exemplary coded matrix onto a holographic page.

Subsequently, the encoded two dimensional coded matrix D can be transmitted via a channel. For example, the two dimensional coded matrix D can be written into page 300. FIG. 11 shows an exemplary recording profile for coded matrix D on page 300. As can be seen, the vector [I1-I6] of horizontal dimension can be recorded in domain 306, and majority of the vectors [I7-I12] and [I13-I8] can be recorded in domain 302 and 304. It can be derived that an average SNR of the vector [I1-I16] is lower than average SNRs of the vectors [I17-I12] and [I113-I18] because SNR of domain 306 is lower than SNRs of domain 302 and 304. Therefore, higher error rate can be expected for vector [I1-I16], if codes of same error correction levels are used for encoding the mentioned horizontal vectors. An ERSEC system can be applied to level the error rate of vectors.

Figure 12:
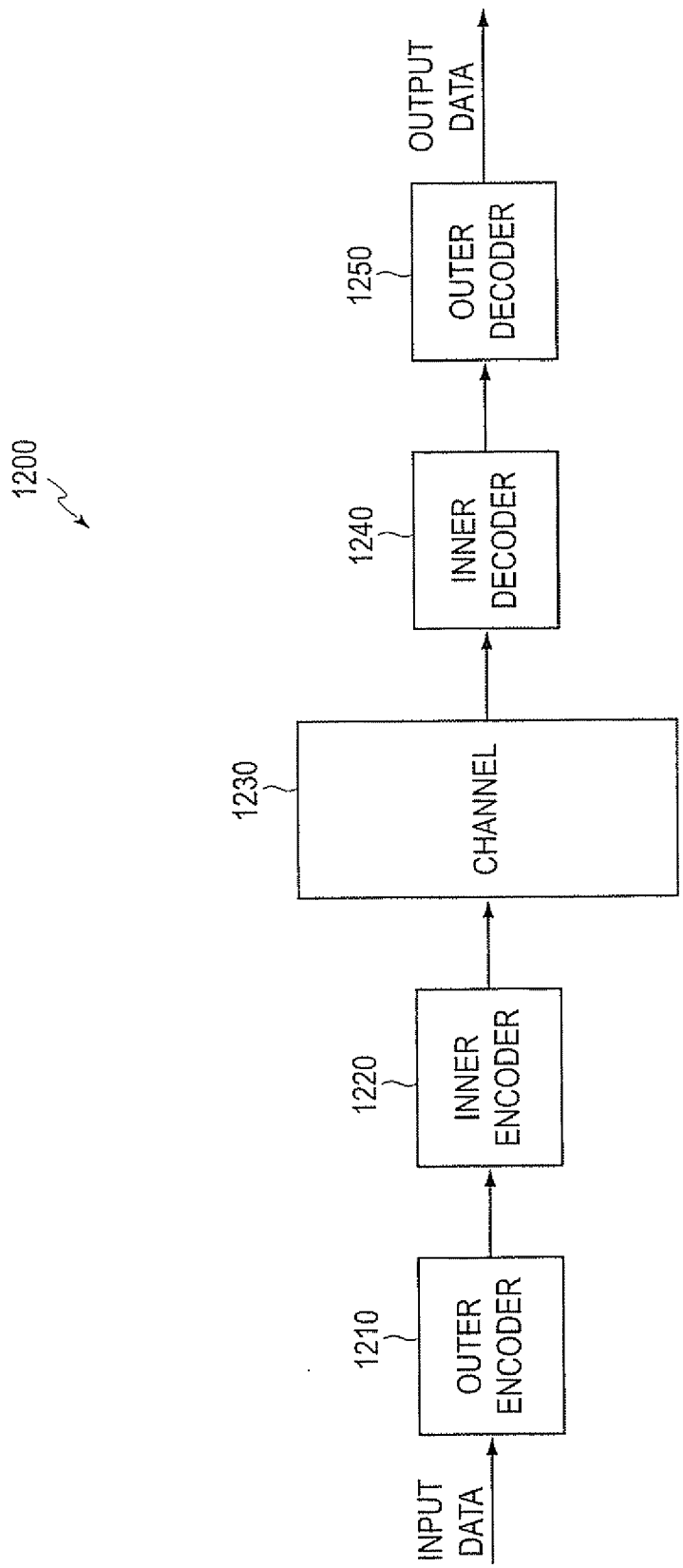
FIG. 12 shows an exemplary ERSEC system employing product code.

FIG. 12 shows a block diagram of an exemplary ERSEC system 1200 including an outer encoder 1210, an inner encoder 1220, a channel 1230, an inner decoder 1240 and an outer decoder 1250. As in FIG. 1, the channel 1230 may include any medium or device that data can transit between encoders and decoders. The outer encoder 1210 can be a page level encoder that receives original input data, and adds redundant information at the page level. The inner encoder 1220 can include an encoder that applies product code on data that is arranged into a matrix form. For example, data can be arranged into a three-dimension book having a set of two-dimensional pages, and the above mentioned product code can be applied on each page. Further, the inner encoder 1220 can encode vectors of the data matrix with different error correction levels. The encoded data are then transmitted over the channel 1230, and decoded by the inner decoder 1240 first, by the outer decoder 1250 next.

In an embodiment, ERSEC system can assign codes with different level of error correction capability to different vectors. The codes can be Hamming codes, Reed-Solomon codes, or regular low-density parity-check (LDPC) codes. For example, two codes can be prepared for generating the horizontal codevectors of the exemplary coded matrix D in FIG. 10: code 1, code 2, where code 1 has greater correction capability than code 2. Subsequently, code 1 can be used for encoding vector [I1-I16], while code 2 can be used for encoding vector [I17-I12] and [I13-I18], where, for example, the parity symbols P1 and P2 correspond to code 1 and the parity symbol P3-P6 correspond to code 2. Therefore, the high level of error correction by code 1 can compensate for the low average SNR of vector [I1-I16]. Thus, the horizontal vectors can have relative steady error rate comparing to using codes of the same error correction level. It should be understood that while the exemplary ERSEC system acts on horizontal vectors, it can act on vertical vectors or vectors across different pages as well.

Figure 13:
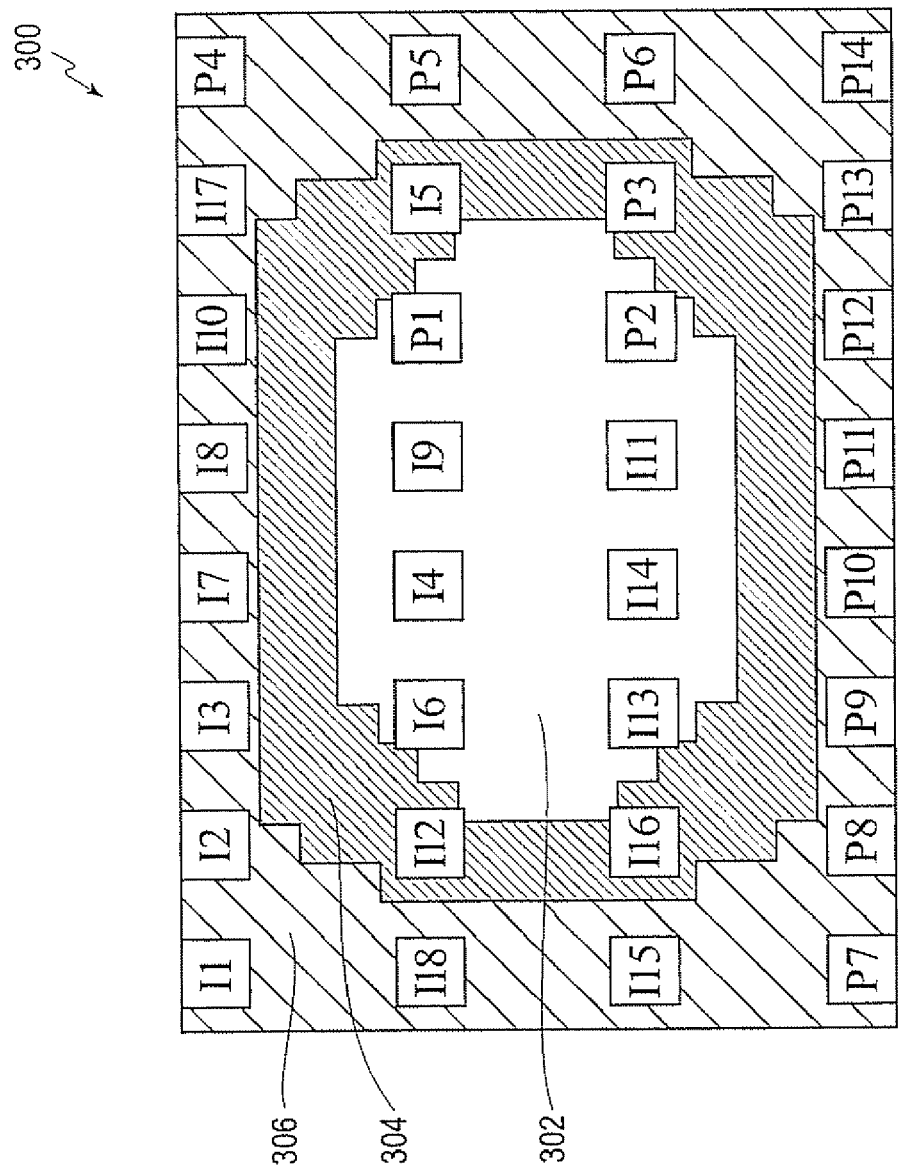
FIG. 13 shows another exemplary recording profile of the exemplary coded matrix onto the holographic page.

In another embodiment, ERSEC system can distribute symbol bits to SNR domains according to a predetermined recording profile to achieve relative steady error rate. FIG. 13 shows another exemplary recording profile of the coded matrix D on page 300. The exemplary recording profile can permute the symbol bits of the coded matrix D across different SNR domains. As can be seen, for each of the horizontal vectors [I1-I16], [I17-I12], and [I13-I18], three bits are in domain 306, one bit is in domain 304 and two bits are in domain 302. Therefore, the horizontal vectors [I1-I16], [I7-I12], and [I13-I18] can have substantially same average SNRs. Additionally, the average SNRs of vertical vectors [I1 I7 I13], [I12 I8 I14], [I3 I9 I15], [I5 I11 I17], and [I6 I12 I18] can be evened out by the exemplary recording profile. Thus, codes of the same error correction level can be used to encode the horizontal vectors to achieve relative steady horizontal vector-wise error rates. Similarly, codes of the same error correction level can be used to encode the vertical vectors to achieve relative steady vertical vector-wise error rates. The codes can be Hamming codes, Reed-Solomon codes, or regular LDPC.

In another embodiment, ERSEC system can use irregular LDPC codes, which are linear block codes that include sparse parity check matrices (H). Codevectors of a LDPC code are generated in an encoder by matrix multiplying an input data vector m (e.g., a video frame) by a generator matrix G, as follows:

$$\text{codevector} = G \times m. \qquad (1)$$

Parity-check matrix (H-matrix) has the following property:

$$H \times \text{codevector} = 0. \qquad (2)$$

Generally, the H-matrix is not unique and thus, for any specific application, an appropriate H-matrix can be selected. As discussed below, an H-matrix can be selected so that a mixture of variable node degrees is consistent with desired levels of error correction.

When a transmitted codevector is received (received-codevector) over a channel and errors were introduced, H×received-codevector can not equal to 0. However, an iterative message passing decoding process can be performed that can correct errors in the received-codevector so that the input data can be recovered within an acceptable level of confidence.

Figure 14:
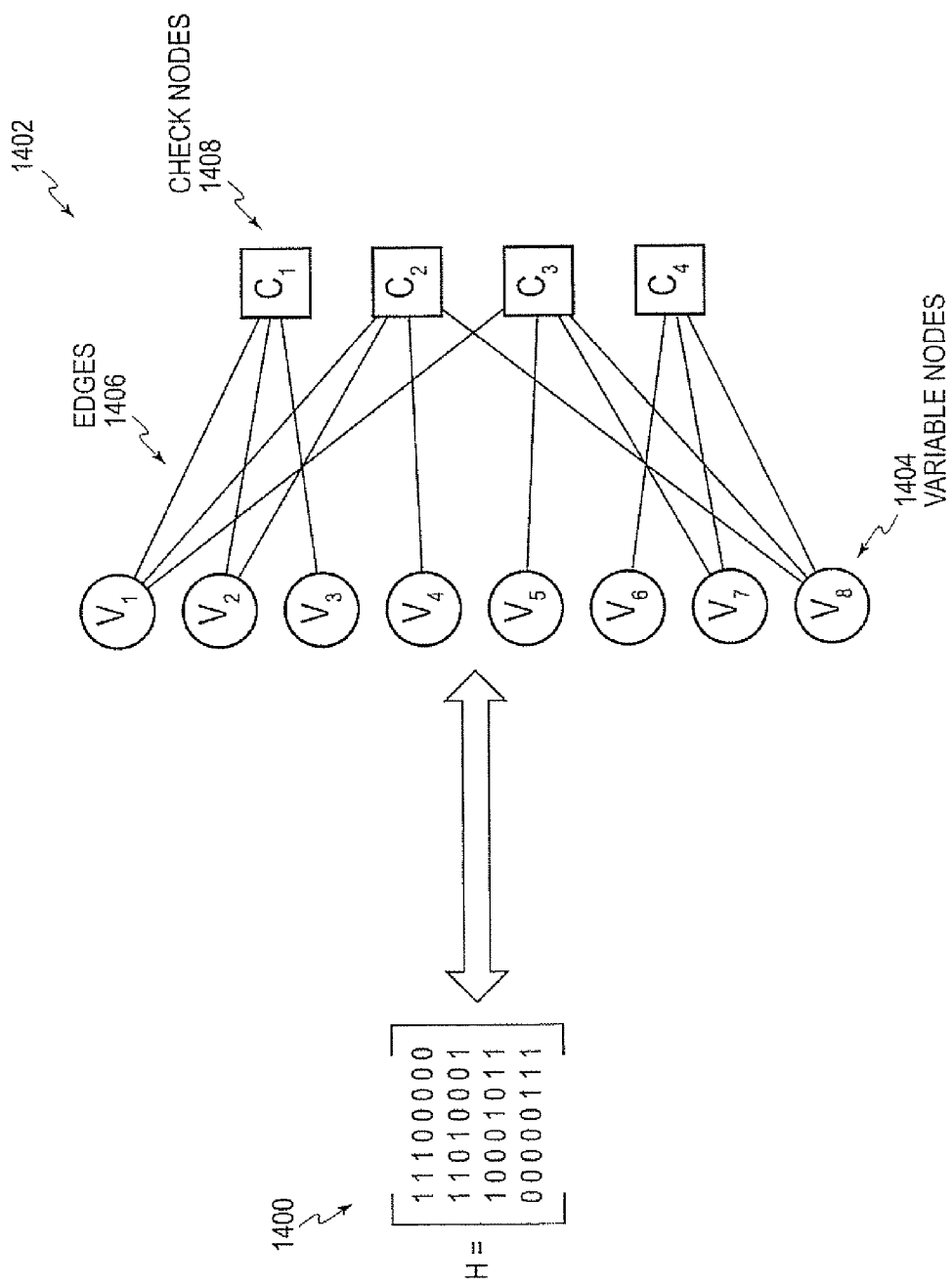
FIG. 14 shows an exemplary parity-check matrix and a corresponding Tanner graph.

FIG. 14 shows an example H-matrix 1400. H-matrix 1400 is not an actual H-matrix because an actual H-matrix is sparse which means that the number of 1s in each row and the number of 1s in each column are small compared to the number of rows and columns in the actual H-matrix, for example.

H-matrix 1400 can be represented as a Tanner graph 1402, where variable nodes 1404, indicated as $V_1$-$V_8$, represent bits of the receive-codevectors and correspond to columns of H-matrix 1400. Check nodes 1408 correspond to rows of H-matrix 1400. Edges 1406 connect each variable node 1404 with at least one of check nodes 1408 as indicated by row positions of the 1s in the column that corresponds to each variable node 1404. A number of edges 1406 connected to a variable node 1404 is referred to as a degree of the variable node 1404. For Tanner graph 1402, variable node $V_1$ has a degree of 3, variable node $V_2$ has a degree of 2, variable node $V_3$ has a degree of 1, and so on. In a given Tanner graph 1402, the error correction capability that corresponds to a variable node 1404 typically increases as the degree of that variable node 1404 increases. Thus, as discussed below, within the context of LDPC codes, ERSEC system 100 assigns bits of a codevector that require greater error correction capacity to variable nodes 1404 that have greater degrees.

Figure 15:
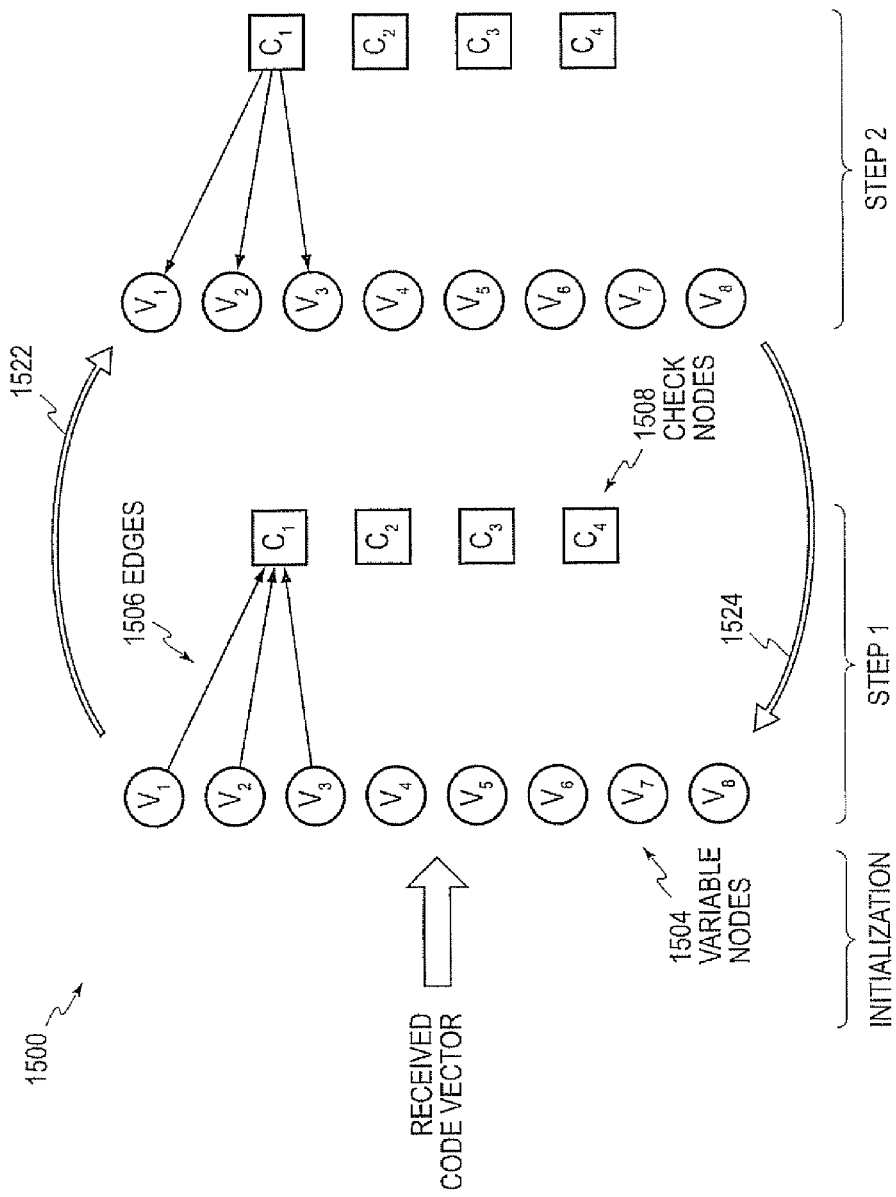
FIG. 15 shows an exemplary diagram of an iterative message passing decoding process.

FIG. 15 shows a diagram 1500 of the iterative message passing process mentioned above that follows the process for check node $C_1$ and variable $V_1$ for one iteration. The process is an exemplary description of a hard decoding algorithm, and is as follows:

Initially, variable nodes $V_1$-$V_8$ are loaded with corresponding bits of a received-codevector. For example, if the received-codevector is 11010011, then $V_1$ is set to a 1, $V_2$ is set to a 1, $V_3$ is set to a 0, $V_4$ is set to a 1, $V_5$ is set to a 0, $V_6$ is set to a 0, $V_7$ is set to a 1, and $V_8$ is set to a 1;

In step 1 of the process, each variable node 1504 evaluates a correct value of the originally transmitted codevector bit that corresponds to the variable node 1504. In the first step 1 that follows immediately after initialization, the received-codevector bit that is loaded is assumed to be the correct value. For subsequent execution of step 1, each variable node 1504 can simply return to connected check nodes 1508 a value that is received from a larger number of connected check nodes 1508 after execution of a step 2 described below. The evaluated correct value is sent via a message to check nodes 408 that are connected by an edge 1506 to each variable node 1504. Thus, in FIG. 15, $V_1$, $V_2$, and $V_3$ sends 1, 1 and 0, respectively to check node $C_1$;

In step 2, each check node 1508 evaluates for each connected variable node 1504, a value that the variable node 1504 must have to achieve correct parity (even parity, for example) based on the variable node values sent to the check node 1508 by all other variable nodes 1504 that are connected to the check node 1508. The values determined in this way are known as extrinsic messages, as they are based on the information from all neighboring nodes except the one to which the information is returned. The determined extrinsic value (which are not necessarily the same) for each of the variable nodes 1504 is returned to each of the connected variable nodes. Thus, the values sent back to the variable nodes $V_1$, $V_2$ and $V_3$ are: 1, 1, 0, respectively; and Steps 1 and 2 are repeated until a confidence level exceeds a predetermined value, which indicates that the value for each of the variable nodes 1504 is correct, or until a predefined number of decoding iterations are reached. In this example, the originally loaded values for $V_1$, $V_2$ and $V_3$ appear to be correct and the process ends in only one cycle (iteration) if based only on the operation of check node $C_1$. However, Tanner graph 1502 includes many more edges 1506 and check nodes 1508, and the result of all the check nodes 1508 must exceed the required confidence level before the iterations of steps 1 and 2 can be stopped.

While the above-described decoding process makes "hard-decisions" in each of the steps 1 and 2, a "soft-decision" can be used in which probability mass function (PMF) (i.e., the probabilities whether a bit-value is a 1 or a 0) is used. For example, instead of initializing variable nodes 1504 with bits of the received-codevector, PMF of whether a variable node 1504 is a 1 or a 0 is provided as inputs. The initial PMFs loaded into variable nodes 1504 can be determined based on the received real-values and on an SNR and other channel characteristics, for example. Check nodes 1508 calculate PMFs for each of the connected variable nodes 1504 (i.e., the PMFs of whether the value of each variable node 1504 should be a 1 or a 0). The extrinsic PMFs calculated by check nodes 1508 can be sent back to variable nodes 1504. These PMFs can then be used to compute the new PMFs that are sent back to check nodes, and so on. The decoding procedure stops when the PDFs for the values of all variable nodes 1504 exceed a threshold value or confidence level or when the maximum (predefined) number of iterations is reached.

Figure 16:
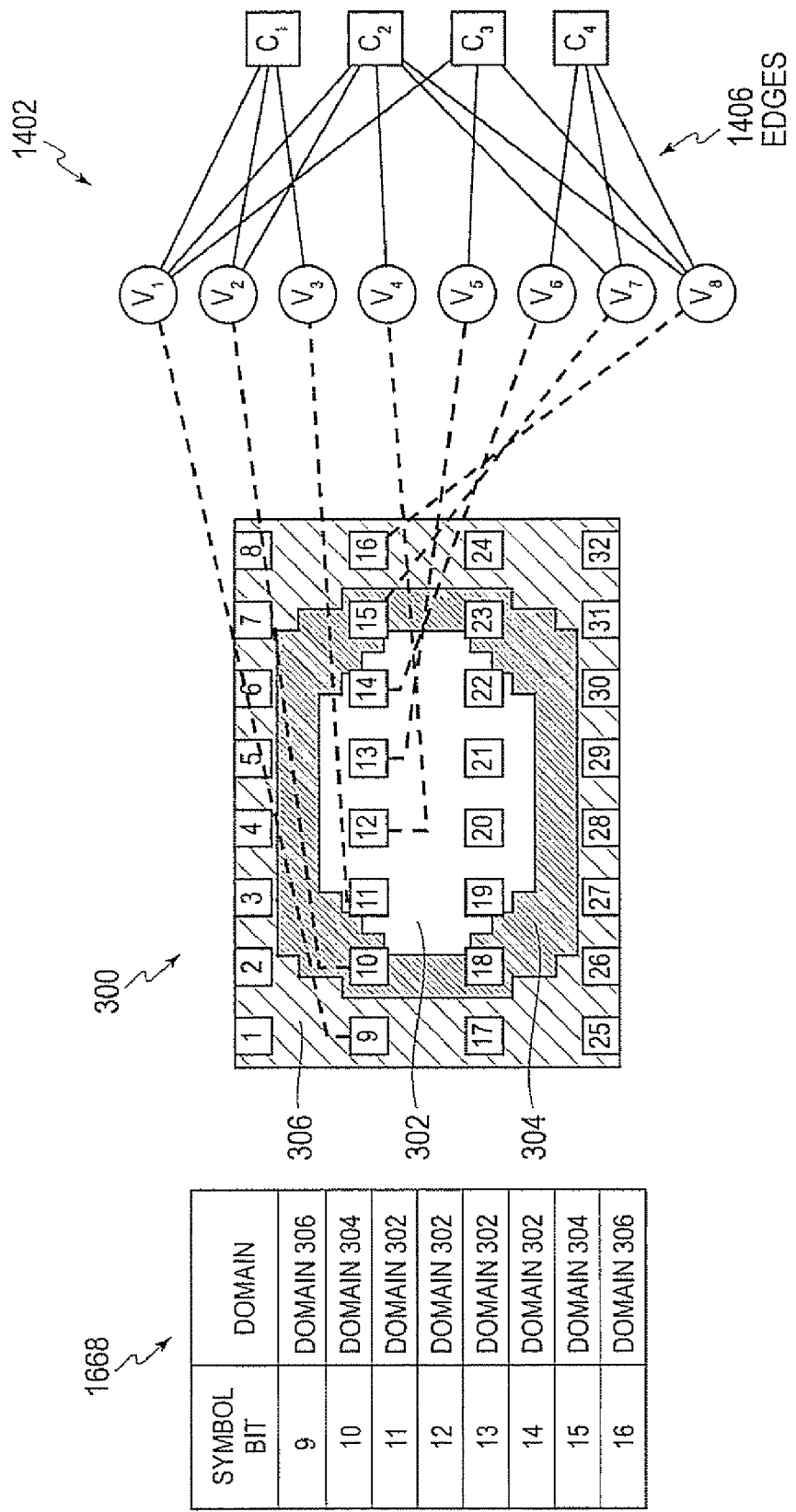
FIG. 16 shows an exemplary ERSEC system employing Low-Density Parity-Check (LDPC)

FIG. 16 shows an example of ERSEC system using irregular LDPC scheme described above acting on the exemplary page 300 of the holographic recording medium. Assuming H-matrix 1400 of FIG. 14 is the parity-check matrix, then bits 9-16 are mapped into variable nodes $V_1$-$V_8$ of Tanner graph 1402 as shown by dashed lines, and the variable nodes $V_1$-$V_8$ are connected to check nodes $C_1$-$C_4$ by edges 1406. Consistent with the LDPC coding scheme discussed above, symbol bits located in a domain having a high SNR are mapped to variable nodes that have a low degree (i.e., a smaller number of emanating edges 1406), while symbol bits located in a domain having a low SNR are mapped to variable nodes having a high degree (i.e., a larger number of edges 1406). As shown, symbol bits 9 and 16 that are located within domain 306 are mapped to variable nodes $V_1$ and $V_8$, respectively, each of which has three edges 1406; symbol bits 10 and 15 located within domain 304 are mapped to variable nodes $V_2$ and $V_7$, respectively, each of which has two edges 1406; and symbol bits 11, 12, 13 and 14 located within domain 302 are mapped to variable nodes $V_3$, $V_4$, $V_5$, and $V_6$, respectively, each of which has one edge 1406.

Figure 17:
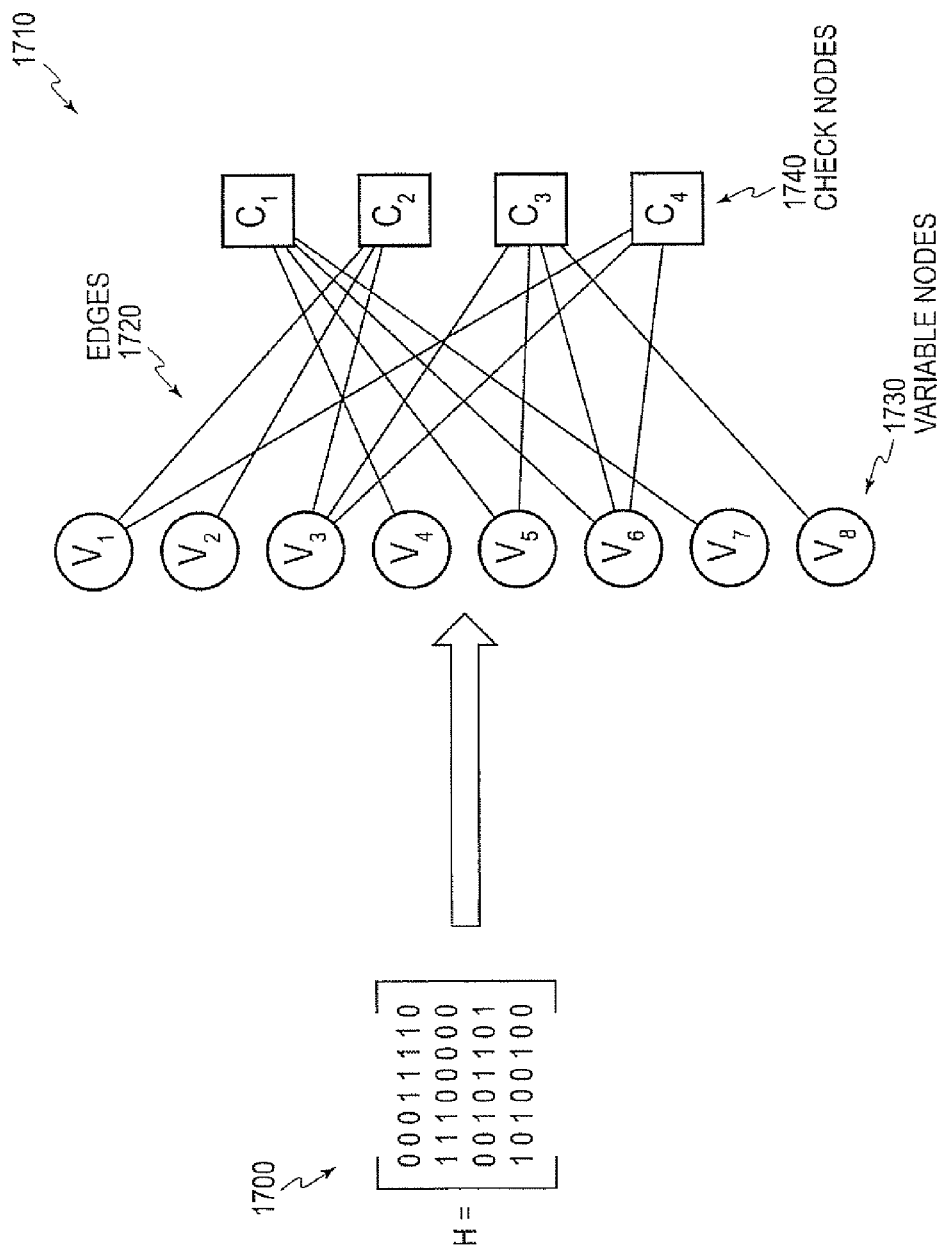
FIG. 17 shows a second exemplary parity-check matrix and a corresponding Tanner graph.
Figure 18:
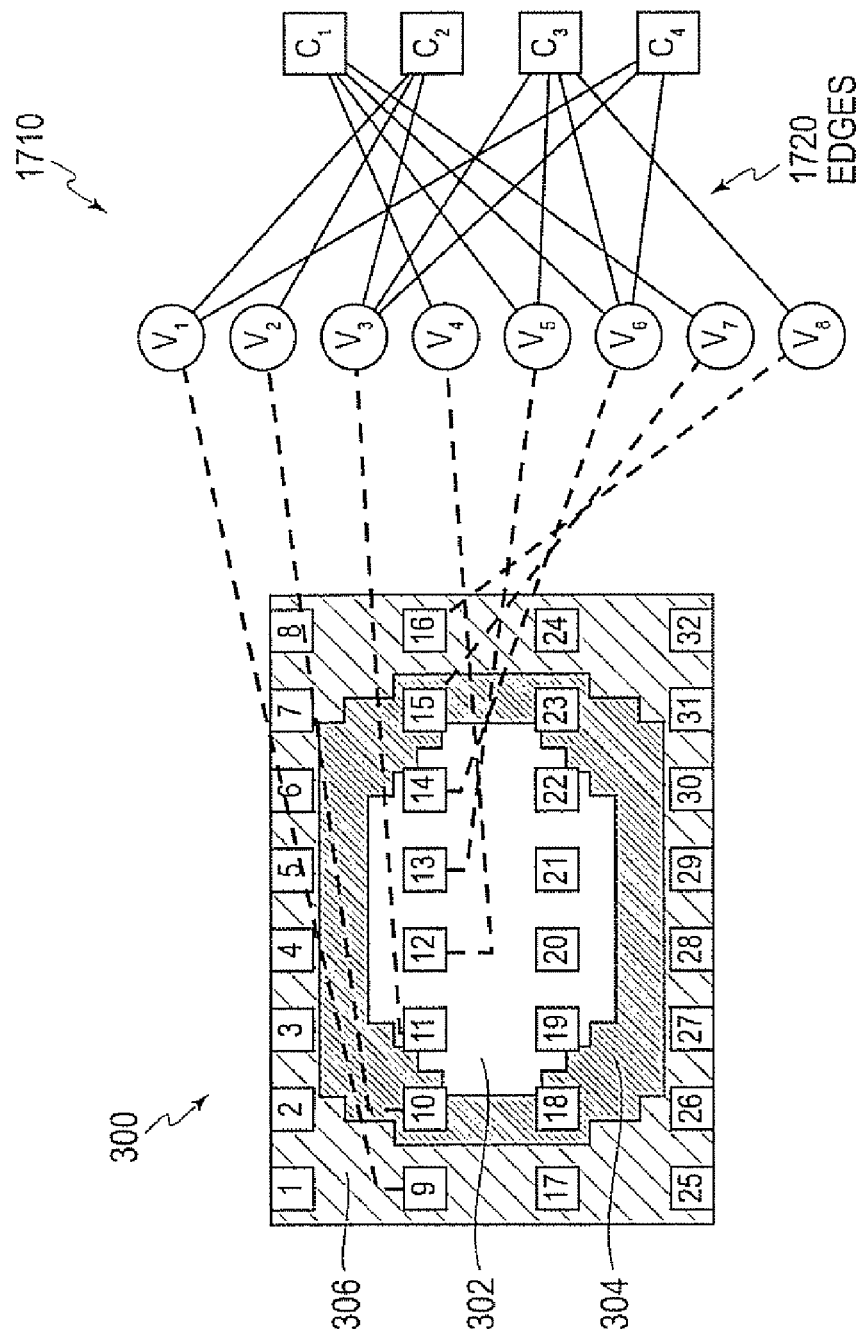
FIG. 18 shows a first exemplary bit-to-variable node mapping scheme with the second exemplary parity-check matrix.

FIG. 17 illustrates another possible H-matrix 1700 and a corresponding Tanner graph 1710. Again, as with H-matrix 1400, H-matrix 1700 is not an actual H-matrix, but is used to illustrate mapping of symbol bits of a codevector to variable nodes $V_1$-$V_8$. FIG. 18 shows positions of symbol bits 9-16 in page 300 to be the same as that shown in FIG. 16 having the same table 1668 of symbol bits to domain mapping. However, when the symbol bits are mapped into variable nodes $V_1$-$V_8$ of Tanner graph 1710 having edges 1720, bits 9 and 16 that require a high level error correction are mapped into variable nodes $V_1$ and $V_8$, which has degree 2 and 1, respectively. Further, bits 11, 12, 13 and 14, which require only a low level of error correction, are mapped into variable nodes $V_3$, $V_4$, $V_5$, and $V_6$, which has degree 3, 1, 2 and 3 respectively. Thus, given H-matrix 1700, the mapping of symbol bits 9-16 must be changed so as to position each of the symbol bits 9-16 in appropriate domains 302-306 so that the degree of variable nodes $V_1$-$V_8$ may match the needed level of error correction.

Figure 19:
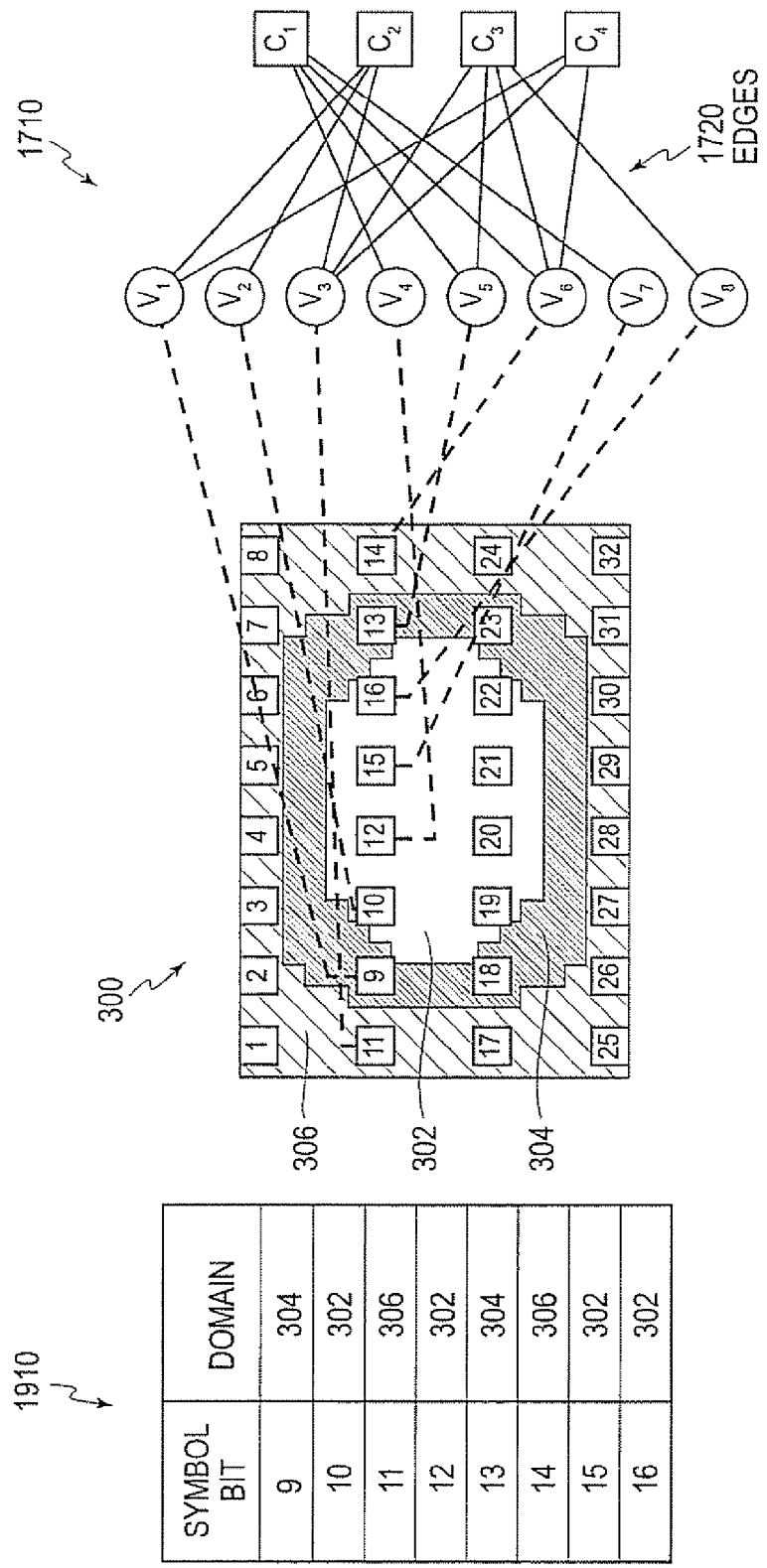
FIG. 19 shows a second exemplary bit-to-variable node mapping scheme with the second exemplary parity-check matrix.

FIG. 19 shows another exemplary mapping of symbol bits 9-16 into domains 302-306 that aligns the degrees of variable nodes $V_1$-$V_8$ with needed levels of error correction for bits 9-16. Table 1910 shows a mapping of symbol bits 9-16 of the codevector and domains 302-306. As shown, bits 11 and 14 may be positioned in domain 306 because bits 11 and 14 must be associated with variable nodes $V_3$ and $V_6$, respectively, which each has a degree of 3, thus providing the needed high level of error correction. Bits 9 and 13 are now positioned in domain 304 which requires intermediate level of error correction and are now associated with variable nodes $V_1$ and $V_5$, each of which has a degree of 2. Bits 10, 12, 15 and 16 are now positioned in domain 302, which requires low level of error correction. It should be understood that while the exemplary ERSEC system acts on a horizontal vector, it can act on a vertical vector or a third dimension vector as well.

In view of the relationship between variable node degrees and levels of error correction, an H-matrix should be selected so that a mixture of variable node degrees is consistent with needed levels of error correction. After an H-matrix is obtained, bits of the codevector should be mapped into domains that result in desired levels of error correction based on the degrees of variable nodes as specified by the H-matrix.

Figure 20:
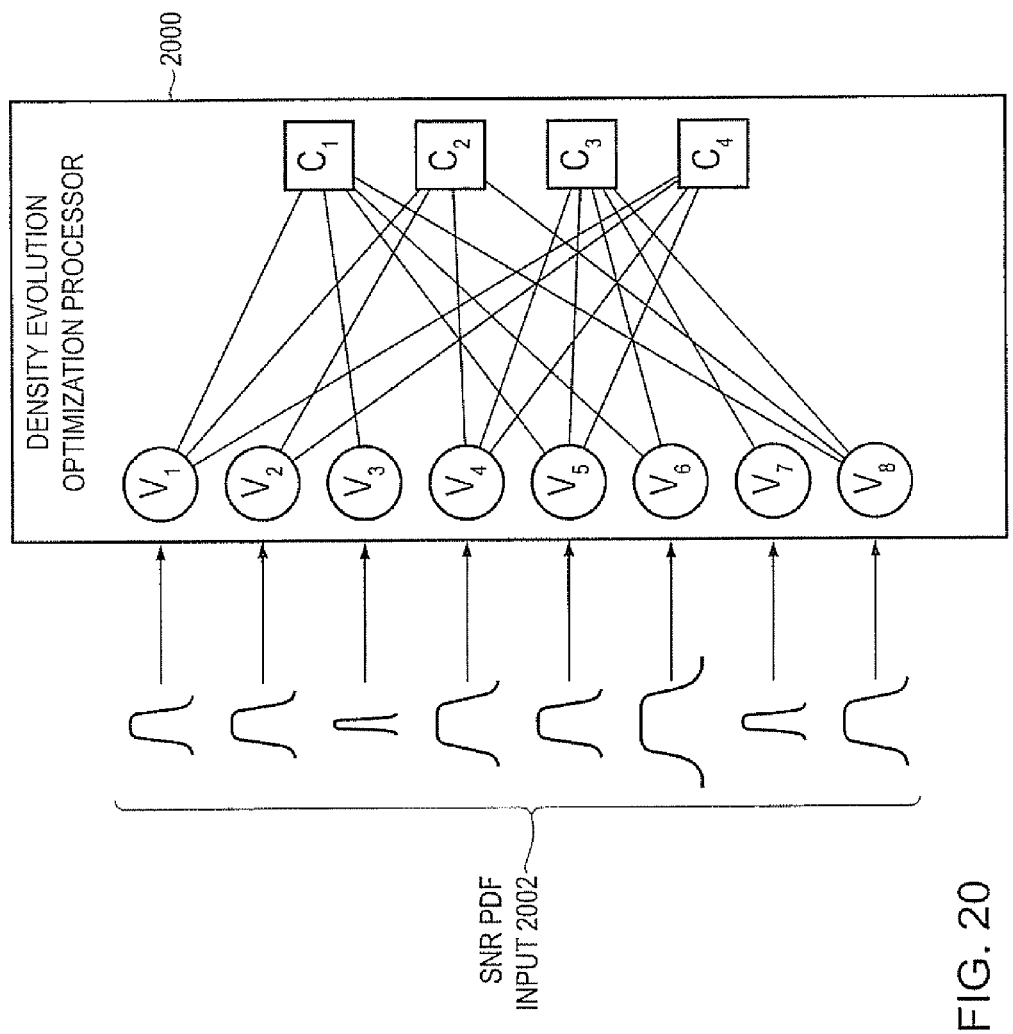
FIG. 20 shows an exemplary density evolution optimization processor.

The assignment of bits of the codevector to variable nodes of a Tanner graph for a particular H-matrix may be optimized using a density evolution process. As shown in FIG. 20, a density evolution optimization processor 2000 receives SNR PDFs 2002 as inputs and associates each of the SNR PDFs with a variable node based on results of the iterative message passing process discussed above. Instead of using PDFs indicating whether a variable node is a 1 or a 0, the SNR PDFs are loaded into the variable nodes. After iterating for a fixed number of cycles through steps 1 and 2, an average PDF may be derived for each variable node that indicates the confidence level of correctness of each variable node value. Thus, by using this indication as a feedback parameter, density evolution optimization processor 2000 may search for a codeword bits to variable nodes mapping that achieves greater confidence levels.

Density evolution optimization processor 2000 can be designed not to be limited to assigning variable nodes having a same degree to inputs having a same SNR PDF (SNR). Thus, the codevector-to-variable node mapping may result in an average degree $\bar{d}_i$ corresponding to a particular $SNR_i$. For codevectors having $m_{ji}$ bits assigned to variable nodes of degree j corresponding to $SNR_i$, density evolution optimization processor 500 may achieve an average degree $\bar{d}_i$ corresponding to $SNR_i$ as follows:

$$\bar{d}_i = \frac{1}{n_i} \sum_{j=1}^{L} j \cdot m_{ji}, \qquad (3)$$

where $n_i$ is a total number of bits of the codeword that corresponds to $SNR_i$. Density evolution optimization and its extensions, therefore, can be used to directly relate variable node degrees and levels of error correction (e.g., SNR profiles). This optimizer can output the values of $m_{ji}$ for all i and j. According to this output, we assign variable nodes of degree j to domains corresponding to $SNR_i$. Often, the average degrees corresponding to $SNR_1, SNR_2, \ldots, SNR_k$ satisfy $\bar{d}_1 > \bar{d}_2 > \ldots > \bar{d}_k$ (assuming that $SNR_1 < SNR_2 < \ldots < SNR_k$). However, it should be understood that the density evolution optimization should result in optimized degrees/assignment, regardless of whether this statement is true or not.

Figure 21:
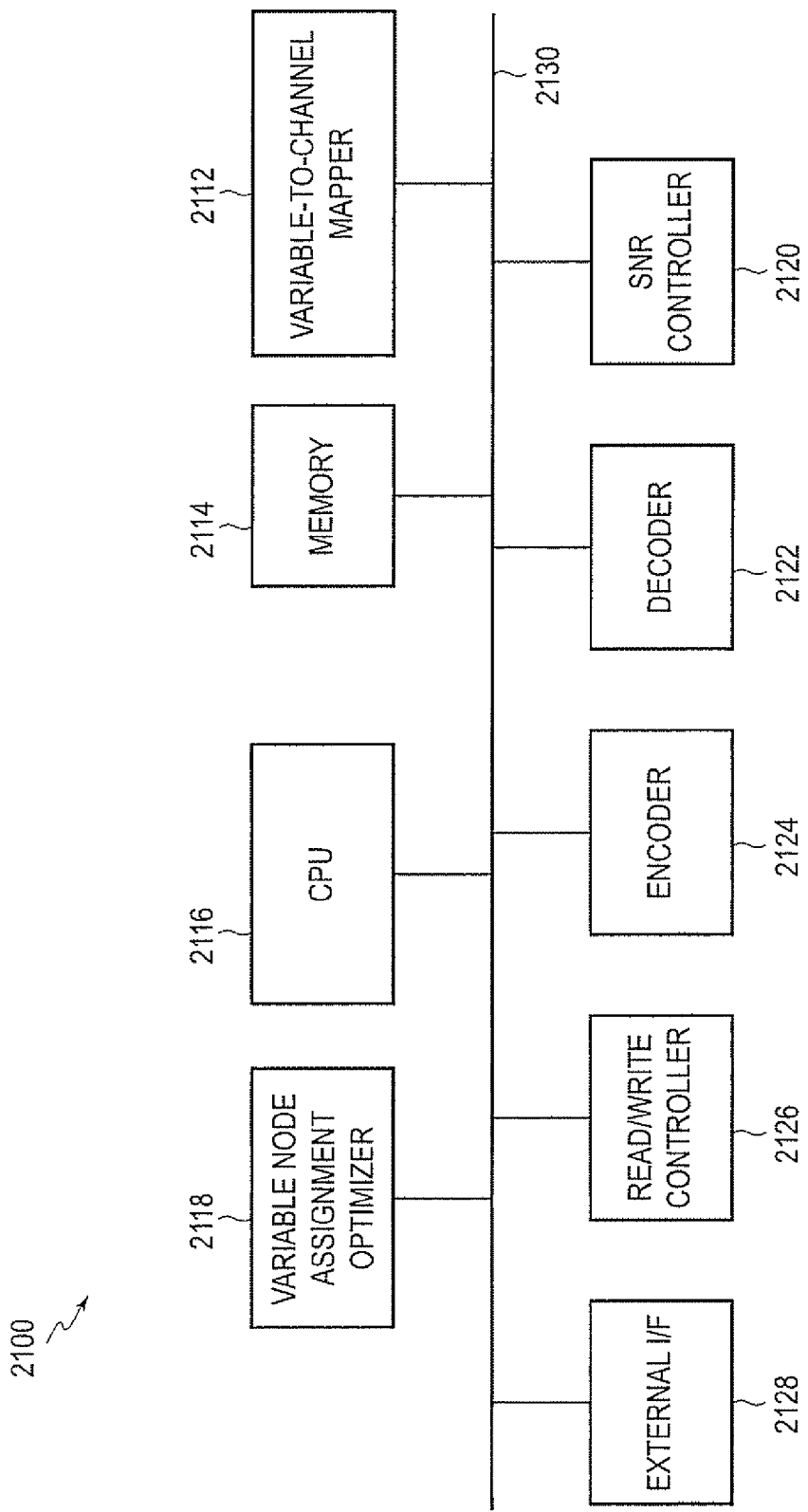
FIG. 21 shows a block diagram of an exemplary ERSEC system.

FIG. 21 shows a block diagram of an exemplary ERSEC system 2100 that includes a variable-to-channel mapper 2112, memory 2114, CPU 2116, variable node assignment optimizer 2118, SNR controller 2120, decoder 2122, encoder 2124, read/write controller 2126 and optionally, an external I/F 2128. The above components are coupled together via a bus 2130. External I/F 2128 may include a user interface, a network interface, and the like to permit communications with external sources such as receiving commands from a user, search for and download files from a website, for example. While FIG. 21 shows ERSEC system 2100 in a bus architecture configuration, any hardware architecture may be used as dictated by actual implementation circumstances. Additionally, while various functions are shown as separate components, the functions performed by these components may be performed in software executing in CPU 2116, for example, or in one or more of the other components that include processing power. Any of the components implemented in hardware may be implemented using PALs, PLIs, Application Specific Integrated Circuits (ASICs) or other hardware techniques.

CPU 2116 performs general ERSEC system control functions such as initializing the other components 2112 and 2118-2128, for example. Coordination among these other components 2112 and 2118-2128 may be achieved by exchanging messages with CPU 2116. CPU 2116 may also regulate periodic SNR detection executed by SNR controller 2120 for example. As noted above, CPU 2116 may also perform a part or all of the processing associated with any of the components 2112 and 2118-2128, if necessary.

SNR controller 2120 obtains an SNR profile for a channel. The SNR profile may be generated by a manufacturer of a storage media channel, for example, and SNR controller 2120 may retrieve from an outside source such as a manufacturer's website or from the storage media channel itself and place the SNR profile in memory 2114 for use by other components 2112 and 2116-2126. SNR controller 2120 may estimate the SNR profile for a channel based on characteristics of the channel. For example, SNR controller 2120 may transmit and receive test data via the channel to determine channel parameters for generating an estimated SNR profile. ERSEC system 100 may adaptively adjust levels of error corrections by detecting the SNRs of a channel periodically, in real time (i.e., adjusting error correction levels continuously based on most current detected data), on command, or by any other technique, so that consecutive codevectors may be encoded differently based on the detected SNR profile. Further, SNR controller 2120 may simplify the SNR profile according to the characteristics of the channel. For example, SNR controller 2120 may aggregate adjacent symbol bits into larger GF when adjacent symbol bits have high correlations.

Variable-to-channel mapper 2112 may input an SNR profile from memory 2114, for example, and information relating to variable nodes and their associated degrees. Variable-to-channel mapper 2112 may perform the mapping function using a table-look-up process where a codevector bit is assigned to a variable node based on the available variable nodes having a closest degree to a desired degree. The desired degree may be obtained based on a degree-to-SNR table that may be generated before the codevector bit-to-variable node assignment process. For example, a predetermined degree-to-SNR table may be generated by an ERSEC system designer and stored in memory 2114. In addition, these two tables may be combined beforehand into an SNR-to-variable node table so that codevector bit-to-variable node assignments may be quickly performed especially in adaptive ERSEC system implementations.

Variable-to-channel mapper 2112 may send mapping information to variable node assignment optimizer 2118 to obtain an optimized codevector bit-to-variable node assignment. To facilitate convergence, variable-to-channel mapper 2112 may send an initial assignment based on the table-look-up process to variable node assignment optimizer 2118. When variable node assignment optimization is completed, variable node assignment optimizer 2100 may return the optimized assignment to variable-to-channel mapper 2112 so that a codevector permutation table may be stored in memory 2114 or loaded into encoder 2124 and decoder 2122 for encoding and decoding processes.

When input data is ready to be encoded, encoder 2124, which can include a product code encoder, may arrange input data into a matrix form if the input data is in sequence form. The matrix may have a first dimension and a second dimension. Encoder 2124 can generate codevectors of the first dimension based on the matrix, and then generate codevectors of the second dimension based on a matrix formed by the codevectors of the first dimension. The codevectors of the second dimension can then form a coded matrix. Further, encoder 2124 can generate a codevector according to ERSEC system. Encoder 2124 can generate the codevector based on a generator matrix G and permute the generated codevector bits according to the codevector permutation table. Encoder 2124 may output the coded matrix to read/write controller 2126 for writing to the channel.

When the coded matrix is received from read/write controller 2126, decoder 2122 can decode the received coded matrix. The received coded matrix can include the first dimension and second dimension codevectors. Decoder 2122 can decode received codevectors of the second dimension first, and then decode received codevectors of the first dimension next. To decode a codevector that was encoded according to ERSEC system, decoder 2122 permutes the codevector to convert the data into a received-codevector and performs the iterative message passing process to generate a retrieved-codevector. As noted above, the iterative message passing process performs error correction. After generating the retrieved-codevector, decoder 2122 performs the required matrix operations to obtain decoded-data from the retrieved-codevector. If the decoding procedure is successful, the decoded-data is identical to the input data received by encoder. This should happen with high probability so that low decoded BERs are achieved.

Based on the above described functions, ERSEC system 100 may first determine the SNR profile for a channel via an SNR controller 2120 and determine a codevector bit-to-channel mapping based on the SNR profile and a symbol bit arrangement of the codevector. CPU 2116 may either select an H-matrix out of many possible H-matrices, or retrieve an H-matrix from memory 2114 that may have been pre-specified by an ERSEC system designer. When the symbol bit-to-channel mapping and the H-matrix are obtained, ERSEC system 100 may determine a variable-to-channel mapping via variable-to-channel mapper 2112 that outputs a codevector bits permutation table for initializing encoder 2124, decoder 2122, and/or read/write controller 2126. The pei mutation table together with the H-matrix implements a higher level of error correction to codevector bits that are expected to experience lower SNRs, and lower level of error correction to codevector bits that are expected to experience higher SNRs. When input data is ready for writing, encoder 2124 encodes the input data as discussed above and sends the encoded data to read/write controller 2126 for writing to the channel. When read/write controller 2126 receives data from the channel, the received data is sent to decoder 2122 to obtain decoded-data. As noted above, the permutation process may be performed by read/write controller 2126. Thus, the permutation table may be used only in read/write controller 2126. Encoder 2124 may output codevectors, and decoder 2122 may receive received-codevectors.

Figure 22:
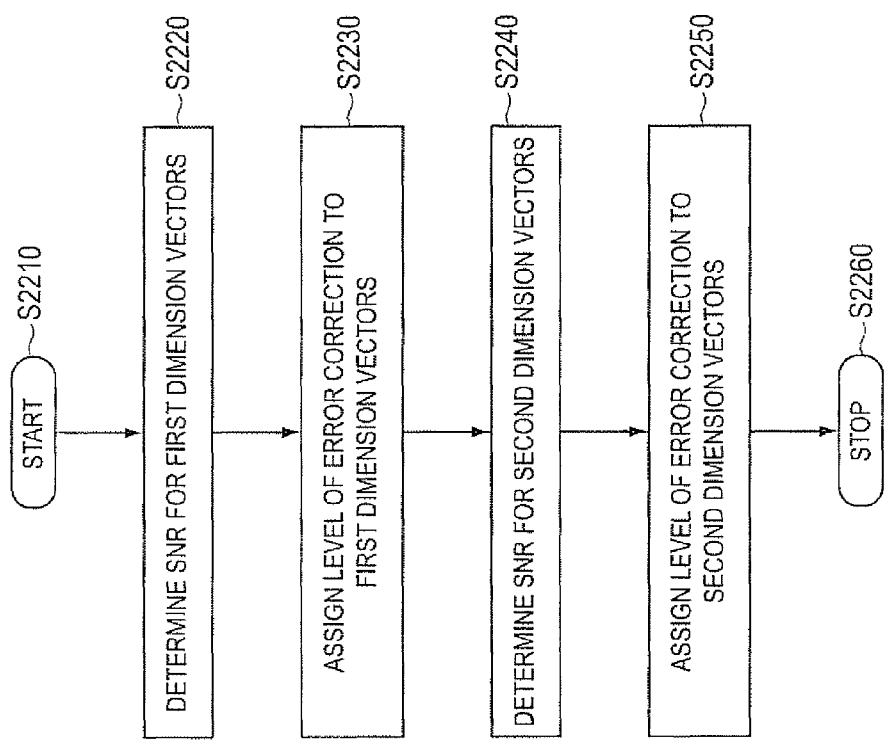
FIG. 22 shows a flowchart outlining an exemplary ERSEC system acting on a product code scheme.

FIG. 22 shows a flowchart outlining an exemplary ERSEC procedure acting on both first and second dimensions of product code. The process starts at step S2210, and proceeds to step S2220 where a SNR profile for a first dimension can be determined. For example, to apply multiple-code technique to the first dimension, an average SNR can be determined for each vector of the first dimension. Then the process proceeds to step S2230, where levels of error correction are assigned for the first dimension vectors. For example, codes of different error correction levels can be assigned to first dimension vectors according to the average SNRs. The first dimension vectors can then be encoded according to the assigned level of correction.

Subsequently, the process proceeds to step S2240. In step S2240, a SNR profile for the second dimension can be determined. For example, to apply irregular LDPC technique to the second dimension vectors, SNRs for symbol bits can be determined. Then the process proceeds to step S2250, where levels of error correction are assigned for the second dimension vectors. For example, an H matrix can be determined, each symbol bit of the second dimension code vector is assigned to a variable node of the H matrix. The second dimension vectors can then be encoded according to the assigned level of correction. For example, a corresponding generator matrix can multiply an assigned second dimension vector to generate a codevector. The process then proceeds to step S2260, and terminates.

While two dimensions have been illustrated in the exemplary matrix, it should be understood that the method and apparatus can be extended to three or more dimensions. Further, while the exemplary ERSEC system acts on product code, it should be understood that it can act on other coding techniques involving a first dimension and a second dimension, for example turbo product code.

It should be understood that the above description involving a holographic storage device is merely for illustrative purposes. The ERSEC system can be used in any application where data is transmitted over a channel having multiple SNRs across spatial or temporal dimensions, or both. An example of the application of the ERSEC system to a channel that has an SNR that varies over time is shown in FIG. 2, for example. The ERSEC system may be applied to channels where the SNR varies both spatially and with time such as a recording media that has time varying SNRs (i.e., media stability changes with time).

The ERSEC system may be embodied in a digital versatile disc (DVD) drive (not shown). The ERSEC system may implement either or both signal processing and/or control circuits and/or mass data storage of the DVD drive. The signal processing and/or control circuit and/or other circuits in the DVD may process data, perform error correction coding and/or encryption, perform calculations, and/or format data that is read from and/or data written to an optical storage medium. In some implementations, the signal processing and/or control circuit and/or other circuits in the DVD can also perform other functions such as encoding and/or decoding and/or any other signal processing functions associated with a DVD drive.

The DVD drive may communicate with an output device such as a computer, television or other device via one or more wired or wireless communication links. The DVD may communicate with mass data storage that stores data in a nonvolatile manner. The mass data storage may include a hard disk drive (HDD). The HDD may be a mini FIDD that includes one or more platters having a diameter that is smaller than approximately 1.8". The DVD may be connected to memory, such as RAM, ROM, low latency nonvolatile memory such as flash memory, and/or other suitable electronic data storage.

The ERSEC system may be embodied in a cellular phone that may include a cellular antenna. The ERSEC system may implement either or both signal processing and/or control circuits, a WLAN interface and/or mass data storage of the cellular phone. In some implementations, the cellular phone includes a microphone, an audio output such as a speaker and/or audio output jack, a display and/or an input device such as a keypad, pointing device, voice actuation and/or other input device. The signal processing and/or control circuits and/or other circuits in the cellular phone may process data, perform error correction coding and/or encryption, perform calculations, format data and/or perform other cellular phone functions.

The cellular phone may communicate with mass data storage that stores data in a nonvolatile manner such as optical and/or magnetic storage devices, for example, HDD and/or DVDs. The cellular phone may be connected to a memory such as RAM, ROM, low latency nonvolatile memory such as flash memory and/or other suitable electronic data storage. The cellular phone also may support connections with a WLAN via a WLAN network interface.

The foregoing detailed description of the ERSEC system has been presented for purposes of illustration and description. It is not intended to be exhaustive or to limit the ERSEC system to the precise embodiments disclosed. Many modifications and variations are possible in light of the above teaching. The described embodiments were chosen in order to best explain the principles of the ERSEC system and its practical application to thereby enable others skilled in the art to best utilize the ERSEC system in various embodiments and with various modifications as are suited to the particular use contemplated. It is intended that the scope of the ERSEC system be defined by the claims appended hereto.

While the invention has been described in conjunction with the specific embodiments thereof, it is evident that many alternatives, modifications, and variations will be apparent to those skilled in the art. Accordingly, embodiments of the invention as set forth herein are intended to be illustrative, not limiting. There are changes that can be made without departing from the spirit and scope of the invention.

What is claimed is:

1. A method for error correction coding of data arranged in a matrix form, comprising:
    encoding first dimension vectors of the data into encoded first dimension vectors, further including:
    assigning, by a controller, at least two first dimension vectors to corresponding SNR domains based on a first dimension signal-to-noise ratio (SNR) profile; and
    assigning, by the controller, corresponding levels of error correction for the assigned first dimension vectors based on SNR magnitudes of the corresponding SNR domains; and
    encoding second dimension vectors of the data into encoded second dimension vectors.

2. The method according to claim 1, further comprising:
    generating the first dimension vectors using at least one of Hamming coding, Reed-Solomon coding, and regular low-density parity-check (LDPC) coding;
    assigning codes of a first level of error correction to the first dimension vectors that are assigned to SNR domains having SNR magnitudes that are below a threshold; and
    assigning codes of a second level of error correction to the first dimension vectors that are assigned to SNR domains having SNR magnitudes that are above the threshold, wherein the first level is higher than the second level.

3. The method according to claim 1, further comprising:
    generating the first dimension vectors using irregular LDPC coding;
    assigning variable nodes having a first level of degrees to portions of the first dimension vectors that are assigned to SNR domains having SNR magnitudes that are below a threshold; and
    assigning variable nodes having a second level of degrees to portions of the first dimension vectors that are assigned to SNR domains having SNR magnitudes that are above the threshold, wherein the first level is higher than the second level.

4. The method according to claim 3, further comprising:
    selecting an H-matrix that includes a mixture of variable node degrees that is consistent with an assignment of levels of error correction; and
    optimizing an assignment of portions of a first dimension vector to variable nodes of the selected H-matrix based on density evolution.

5. The method according to claim 1, further comprising:
generating the first dimension vectors using at least one of Hamming coding, Reed-Solomon coding, and regular low-density parity-check (LDPC) coding; and
permuting bits of the first dimension vectors across different SNR domains.

6. The method according to claim 1, wherein the first dimension vectors are in symbol level.

7. The method according to claim 1, wherein encoding second dimension vectors further comprises:
assigning at least two second dimension vectors to corresponding SNR domains based on a second dimension signal-to-noise ratio (SNR) profile; and
assigning corresponding levels of error correction for the assigned second dimension vectors based on SNR magnitudes of the corresponding SNR domains.

8. The method according to claim 7, further comprising:
generating the second dimension vectors using at least one of Hamming coding, Reed-Solomon coding, and regular low-density parity-check (LDPC) coding;
assigning codes of a first level of error correction to the second dimension vectors that are assigned to SNR domains having SNR magnitudes that are below a threshold; and
assigning codes of a second level of error correction to the second dimension vectors that are assigned to SNR domains having SNR magnitudes that are above the threshold, wherein the first level of error correction is higher than the second level.

9. The method according to claim 7, further comprising:
generating the second dimension vectors using irregular LDPC coding;
assigning variable nodes having a first level of degrees to portions of the second dimension vectors that are assigned to SNR domains having SNR magnitudes that are below a threshold; and
assigning variable nodes having a second level of degrees to portions of the second dimension vectors that are assigned to SNR domains that are above a threshold, wherein the first level is higher than the second level.

10. The method according to claim 9, further comprising:
selecting an H-matrix that includes a mixture of variable node degrees that is consistent with an assignment of levels of error correction; and
optimizing an assignment of portions of a second dimension vector to variable nodes of the selected H-matrix based on density evolution.

11. The method according to claim 7, further comprising:
generating the second dimension vectors using at least one of Hamming coding, Reed-Solomon coding, and regular low-density parity-check (LDPC) coding; and
permuting bits of the second dimension vectors across different SNR domains.

12. The method according to claim 7, wherein the second dimension vectors are in symbol level.

13. An error rate sensitive error correction (ERSEC) device, comprising:
a memory that stores first and second dimension signal-to-noise ratio (SNR) profiles for a channel, the first and second dimension SNR profiles each having a plurality of SNR domains; and
a controller coupled to the memory, the controller being configured to encode first and second dimension vectors, wherein the controller is further configured to:
assign at least two first dimension vectors to corresponding SNR domains based on the first dimension SNR profile; and
assign corresponding levels of error correction for the assigned first dimension vectors based on SNR magnitudes of the corresponding SNR domains.

14. The ERSEC device according to claim 13, wherein the controller is further configured to
generate the first dimension vectors using at least one of Hamming coding, Reed-Solomon coding, and regular low-density parity-check (LDPC) coding;
assign codes of a first level of error correction to the first dimension vectors that are assigned to SNR domains having SNR magnitudes that are below a threshold; and
assign codes of a second level of error correction to the first dimension vectors that are assigned to SNR domains having SNR magnitudes that are above the threshold, wherein the first level is higher than the second level.

15. The ERSEC device according to claim 13, wherein the controller is further configured to:
generate the first dimension vectors using irregular LDPC coding;
assign variable nodes having a first level of degrees to portions of the first dimension vectors that are assigned to SNR domains having SNR magnitudes that are below a threshold; and
assign variable nodes having a second level of degrees to portions of the first dimension vectors that are assigned to SNR domains having SNR magnitudes that are above the threshold, wherein the first level is higher than the second level.

16. The ERSEC device according to claim 15, wherein the controller is further configured to:
select an H-matrix that includes a mixture of variable node degrees that is consistent with an assignment of levels of error correction; and
optimize an assignment of portions of the first dimension vector to variable nodes of the selected H-matrix based on density evolution.

17. The ERSEC device according to claim 13, wherein the controller is further configured to:
generate the first dimension vectors using at least one of Hamming coding, Reed-Solomon coding, and regular low-density parity-check (LDPC) coding; and
permute bits of the first dimension vectors across different SNR domains.

18. The ERSEC device according to claim 13, wherein the first dimension vectors are in symbol level.

19. The ERSEC device according to claim 13, wherein the controller is further configured to assign at least two second dimension vectors to corresponding SNR domains based on the second dimension SNR profile; and
assign corresponding levels of error correction for the assigned second dimension vectors based on SNR magnitudes of the corresponding SNR domains.

20. The ERSEC device according to claim 19, wherein the controller is further configured to:
generate the second dimension vectors using at least one of Hamming coding, Reed-Solomon coding, and regular low-density parity-check (LDPC) coding;
assign codes of a first level of error correction to the second dimension vectors that are assigned to SNR domains having SNR magnitudes that are below a threshold; and
assign codes of a second level of error correction to the second dimension vectors that are assigned to SNR domains having SNR magnitudes that are above the threshold, wherein the first level is higher than the second level.

21. The ERSEC device according to claim 19, wherein the controller is further configured to:
  generate the second dimension vectors using irregular LDPC coding;
  assign variable nodes having a first level of degrees to portions of a second dimension vector that are assigned to SNR domains having SNR magnitudes that are below a threshold; and
  assign variable nodes having a second level of degrees to portions of a second dimension vector that are assigned to SNR domains having magnitudes that are above the threshold, wherein the first level is higher than the second level.

22. The ERSEC device according to claim 21, wherein the controller is configured to:
  select an H-matrix that includes a mixture of variable node degrees that is consistent with an assignment of levels of error correction; and
  optimize an assignment of portions of the second dimension vector to variable nodes of the selected H-matrix based on density evolution.

23. The ERSEC device according to claim 19, wherein the controller is configured to:
  generate the second dimension vectors using at least one of Hamming coding, Reed-Solomon coding, and regular low-density parity-check (LDPC) coding; and
  permute bits of the second dimension vectors across different SNR domains.

24. The ERSEC device according to claim 19, wherein the second dimension vectors are in symbol level.

25. An error correction method, comprising:
  assigning, by a controller, a signal-to-noise ratio (SNR) domain to each component of a first signal vector based on a SNR profile having a plurality of SNR domains, the first signal vector having a plurality of components;
  assigning, by the controller, a level of error correction to each component of the first signal vector based on the corresponding assigned SNR domain; and
  encoding the first signal vector to add redundant information based on the assigned levels of error correction.

26. The method of claim 25, wherein the assigned level of error correction is at least one of Hamming coding, Reed-Solomon coding and regular low-density parity-check (LPDC) coding.

27. The method of claim 25, wherein the level of error correction assigned to a first component of the first signal vector is higher than the level of error correction assigned to a second component of the first signal vector if a magnitude associated with the assigned SNR domain of the first component is lower than a magnitude associated with the assigned SNR domain of the second component by a predetermined amount.

28. The method of claim 25, further comprising:
  generating the first signal vector using irregular LPDC coding; and
  assigning variable nodes having degrees that are higher than a degree threshold to components of the first signal vector that have assigned SNR domains that are below a magnitude threshold.

29. The method of claim 28, further comprising:
  selecting an H-matrix that includes a mixture of variable node degrees that is consistent with an assignment of levels of error correction; and
  optimizing an assignment of components of the first signal vector to variable nodes of the selected H-matrix based on density evolution.

30. The method of claim 25, further comprising:
  generating the first signal vector using at least one of Hamming coding, Reed-Solomon coding, and regular low-density parity-check (LDPC) coding; and
  permuting components of the first signal vector across the plurality of SNR domains.

31. The method of claim 25, wherein the first signal vector is in symbol level.

32. The method of claim 25, further comprising:
  assigning a signal-to-noise ratio (SNR) domain to each component of a second signal vector based on the SNR profile, the second signal vector having a plurality of components; and
  assigning a level of error correction to each component of the second signal vector based on the corresponding assigned SNR domain.

33. The method of claim 32, wherein an average of the assigned SNR domains for the first signal vector is substantially equal to an average of the assigned SNR domains for the second signal vector.

34. An error correction device, comprising:
  a memory configured to store a SNR profile having a plurality of SNR domains; and
  a controller coupled to the memory, the controller being configured to encode a first signal vector having a plurality of components, wherein the controller is further configured to:
    assign a signal-to-noise ratio (SNR) domain of the SNR profile to each component of the first signal vector; and
    assign a level of error correction to each component of the first signal vector based on the corresponding assigned SNR domain.

35. The device of claim 34, wherein the assigned level of error correction is at least one of Hamming coding, Reed-Solomon coding and regular low-density parity-check (LPDC) coding.

36. The device of claim 34, wherein the level of error correction assigned to a first component of the first signal vector is higher than the level of error correction assigned to a second component of the first signal vector if a magnitude associated with the assigned SNR domain of the first component is lower than a magnitude associated with the assigned SNR domain of the second component by a predetermined amount.

37. The device of claim 34, wherein the controller is further configured to:
  generate the first signal vector using irregular LPDC coding; and
  assign variable nodes having degrees that are higher than a degree threshold to components of the first signal vector that have assigned SNR domains that are below a magnitude threshold.

38. The device of claim 37, wherein the controller is further configured to:
  select an H-matrix that includes a mixture of variable node degrees that is consistent with an assignment of levels of error correction; and
  optimize an assignment of components of the first signal vector to variable nodes of the selected H-matrix based on density evolution.

39. The device of claim 34, wherein the controller is further configured to:
  generate the first signal vector using at least one of Hamming coding, Reed-Solomon coding, and regular low-density parity-check (LDPC) coding; and permute components of the first signal vector across the plurality of SNR domains.

40. The device of claim 34, wherein the first signal vector is in symbol level.

41. The device of claim 34, wherein the controller is further configured to:
    assign a signal-to-noise ratio (SNR) domain to each component of a second signal vector based on the SNR profile, the second signal vector having a plurality of components; and
    assign a level of error correction to each component of the second signal vector based on the corresponding assigned SNR domain.

42. The device of claim 41, wherein an average of the assigned SNR domains for the first signal vector is substantially equal to an average of the assigned SNR domains for the second signal vector.

* * * * *